(12) United States Patent
Tanaka et al.

(10) Patent No.: US 8,945,726 B2
(45) Date of Patent: Feb. 3, 2015

(54) POLYMER FOR ORGANIC ELECTROLUMINESCENT ELEMENT, AND ORGANIC ELECTROLUMINESCENT ELEMENT USING THE SAME

(75) Inventors: Hiroshige Tanaka, Kitakyushu (JP); Tohru Asari, Kitakyushu (JP); Kazuto Shiraishi, Kitakyushu (JP); Hiroyuki Hayashida, Kitakyushu (JP); Yasushi Koishikawa, Kitakyushu (JP); Kazuaki Yoshimura, Kitakyushu (JP); Takaya Ishiyama, Kitakyushu (JP)

(73) Assignee: Nippon Steel & Sumikin Chemical Co., Ltd., Tokyo (JP)

( * ) Notice: Subject to any disclaimer, the term of this patent is extended or adjusted under 35 U.S.C. 154(b) by 338 days.

(21) Appl. No.: 13/579,296

(22) PCT Filed: Feb. 7, 2011

(86) PCT No.: PCT/JP2011/052536
§ 371 (c)(1),
(2), (4) Date: Aug. 16, 2012

(87) PCT Pub. No.: WO2011/105204
PCT Pub. Date: Sep. 1, 2011

(65) Prior Publication Data
US 2012/0313513 A1    Dec. 13, 2012

(30) Foreign Application Priority Data

Feb. 26, 2010 (JP) ................................ 2010-042296
Mar. 25, 2010 (JP) ................................ 2010-069585

(51) Int. Cl.
| | | |
|---|---|---|
| H05B 33/14 | (2006.01) | |
| C08F 126/06 | (2006.01) | |
| C08F 26/12 | (2006.01) | |
| H01L 51/00 | (2006.01) | |
| H01L 51/50 | (2006.01) | |

(52) U.S. Cl.
CPC ............ *C08F 26/12* (2013.01); *H01L 51/0042* (2013.01); *H01L 51/5048* (2013.01)
USPC ............ 428/690; 313/504; 526/259; 526/263

(58) Field of Classification Search
USPC ................................................. 526/259, 263
See application file for complete search history.

(56) References Cited

U.S. PATENT DOCUMENTS 7,172,823 B2    2/2007 Sohn et al.
7,402,681 B2    7/2008 Ong et al.

FOREIGN PATENT DOCUMENTS

| JP | 5-205377 A | 8/1993 |
| JP | 11-256148 A | 9/1999 |
| JP | 2003-338378 A | 11/2003 |

OTHER PUBLICATIONS

International Search Report for the Application No. PCT/JP2011/052536 mailed Apr. 26, 2011.
Kraft, A. et al., "Hole-transporting Compounds for Multi-layer Polymer Light-emitting Diodes", Synthetic Metals, 1993, 55-57, pp. 4163-4167.
Kido, Junji et al., "Poly (methylphenylsilane) film as a hole transport layer in electroluminescent devices", Appl. Phys. Lett., Nov. 18, 1991, vol. 59, No. 21, pp. 2760-2762.
Kawano, Tatsuya et al., "Syntheses and Properties of Polymers Containing Indolocarbazole Unit in the Side Chain", Polymer Preprints, 2009, Japan, vol. 58, No. 2, p. 4140, 3Pa117.
Akimoto, Masaji et al., "Syntheses and Photonic Properties of Indolocarbazole Derivatives", Transactions of the Materials Research Society of Japan, 2009, vol. 34, No. 1, pp. 141-144.
Akimoto, Masaji et al., "Syntheses and Photonic Properties of Indolocarbazole Derivatives", Polymer Preprints, 2008, Japan, vol. 57, No. 1, pp. 1364, 1Pe127.
Akimoto, Masaji et al., "Synthesis of Novel Indolocarbazole Derivatives 2: Syntheses and Photonic Properties of Polymers", 88th Annual Meeting of Chemical Society of Japan in Spring Koen Yokoshu I, Mar. 12, 2008, p. 597, 4L7-43.
International Preliminary Report on Patentability for Application No. PCT/JP2011/052536 mailed Oct. 26, 2012.

*Primary Examiner* — Vu A Nguyen
(74) *Attorney, Agent, or Firm* — Cheng Law Group, PLLC

(57) ABSTRACT

Provided are a polymer for an organic electroluminescent element, which improves light emission efficiency of the element and is applicable to a wet process, and an organic electroluminescent element, which is obtained using the polymer. The polymer for an organic electroluminescent element includes a repeating unit represented by the following general formula (1) in a repeating unit constituting a main chain. Further, the organic electroluminescent element includes organic layers between an anode and a cathode laminated on a substrate, in which at least one of the organic layers includes the polymer for an organic electroluminescent element, including an indolocarbazole skeleton in the repeating unit constituting a main chain. In the general formula (1), Z represents an N-indolocarbazolyl group, W represents a charge transporting group, m and n represent molar ratios, m represents 0 to 95 mol %, and n represents 5 to 100 mol.

8 Claims, No Drawings

POLYMER FOR ORGANIC ELECTROLUMINESCENT ELEMENT, AND ORGANIC ELECTROLUMINESCENT ELEMENT USING THE SAME

TECHNICAL FIELD

The present invention relates to a polymer for an organic electroluminescent element having a structure which includes an indolocarbazole unit in its side chain, and to an organic electroluminescent element obtained using the polymer.

BACKGROUND ART

In general, an electroluminescent element includes an inorganic electroluminescent element using an inorganic compound in a light emitting element and an organic electroluminescent element using an organic compound in a light emitting element. In recent years, active studies on practical realization of the organic electroluminescent element have been made because the element can achieve light emission at a low voltage and at a high luminance.

A basic structure of the organic electroluminescent element is obtained by forming a hole injection layer and an organic thin layer such as a light emission layer on a glass plate deposited with a thin film of an anode material such as indium-tin oxide (ITO) and further forming a thin film of a cathode material thereon, and there is known an element obtained by appropriately providing a hole transport layer or an electron transport layer on the basic structure. A construction of layers in the organic electroluminescent element is, for example, anode/hole injection layer/light emission layer/electron transport layer/cathode or anode/hole injection layer/hole transport layer/light emission layer/electron transport layer/cathode.

In recent years, it has been found that when a charge transport layer such as the hole injection layer and the hole transport layer is integrated between the light emission layer and the anode, the layer improves an ability to inject holes into the light emission layer and serves as a buffer layer which optimizes a charge balance to significantly improve light emission efficiency and life of the element.

Hole transporting materials used in the hole transport layer of the organic electroluminescent element are broadly classified into a low-molecular-weight hole transporting material and a high-molecular-weight hole transporting material.

As a method of forming the low-molecular-weight hole transporting material into a film serving as the hole transport layer, a vacuum deposition method is mainly used and has the following characteristics. According to the method, it is easy to produce a multilayer using various materials having different functions, which allows a high-performance organic electroluminescent element to be formed. However, there is a problem in that it is difficult to control a thickness uniformly and to apply different materials depending on parts for achieving a large-screen and high-definition panel, and a large-size vacuum apparatus is required, resulting in an increase in production cost.

Further, as the method of forming the low-molecular-weight hole transporting material into a film serving the hole transport layer, a film formation method involving application of a solution containing the low-molecular-weight hole transporting material has been studied toward practical use. However, it is necessary to improve this technique for practical use because segregation and phase separation due to crystallization of the low-molecular-weight compound are observed.

On the other hand, as a method of forming the high-molecular-weight hole transporting material into a film, a solution application method such as a spin coating method, a printing method, or an ink-jet method is used because most of the material cannot be deposited by the vacuum deposition method. This method can easily enlarge a panel screen and is excellent in terms of mass production. However, this method has problems in that it is difficult to laminate coated films, and contamination with impurities is liable to occur. Therefore, an element including the high-molecular-weight hole transporting material is inferior in element performance such as element efficiency or life as compared with the low-molecular-weight hole transporting material. Therefore, there has been required a high-molecular-weight hole transporting material having excellent hole transporting performance and good film forming property.

As attempts for expressing the required properties, for example, Non Patent Literature 1 discloses polyvinylcarbazole and polysilane, and Patent Literature 2 and Non Patent Literature 2 report polymers having structures in which vinyltriphenylamine and triphenylamine are linked via methylene. However, organic electroluminescent elements including the compounds cannot improve the problems sufficiently because the light emission efficiency and stability of the elements are poor.

In addition, as a technique for enhancing the light emission efficiency of the organic electroluminescent element, a polymer material having a main chain of a π-conjugated polymer including an indolocarbazole unit integrated thereinto, and a light emitting element including the polymer material have been disclosed. That is, Patent Literature 3 discloses a conjugated polymer obtained by bonding indolocarbazole at a peripheral position, and Patent Literature 4 discloses a conjugated polymer obtained by introducing an indolocarbazole unit into a polyarylene main chain. However, the polymers each have an improved charge transporting ability but are not suitable for film formation by a solution application method because a π-conjugated polymer including an indolocarbazole skeleton in a main chain has extremely low solubility in an organic solvent.

Further, Patent Literature 5 discloses a polymer material obtained by integrating a specific indol trimer moiety into a polymer side chain, but sufficient improvement cannot be achieved because the element is unstable.

CITATION LIST

Patent Literature

[PTL 1] JP 05-205377 A
[PTL 2] JP 11-256148 A
[PTL 3] JP 2006-193729 A
[PTL 4] JP 4019042 B
[PTL 5] JP 2003-338378 A

Non Patent Literature

[NPL 1] Appl. Phys. Lett., 59, 2760 (1995)
[NPL 2] Synthetic Metals, 55-57, 4163, (1993)

SUMMARY OF INVENTION

In order to apply a polymer to an organic electroluminescent element, it is necessary to improve a charge transporting ability and to improve stability of a film, solubility in a solvent, and film forming property.

The present invention has been made in view of the above-mentioned problems, and an object of the present invention is to provide a polymer for an organic electroluminescent element, which has high light emission efficiency and is applicable to a wet process. Another object of the present invention is to provide an organic electroluminescent element including the polymer, which is used in a lighting device, an image display device, a back light for a display device, and the like.

The inventors of the present invention have made intensive studies, and as a result, have found that light emission performance can be improved by using a non-conjugated polymer obtained by introducing an indolocarbazole skeleton into a polymer side chain, thus completing the present invention.

The present invention relates to a polymer for an organic electroluminescent element, which is characterized in that an indolocarbazole skeleton, or the indolocarbazole skeleton and a charge transporting skeleton are included in a polymer side chain, and an organic electroluminescent element having organic layers between an anode layer and a cathode layer laminated on a substrate, in which at least one of the organic layers contains the polymer.

The present invention relates to a polymer for an organic electroluminescent element, including a repeating unit represented by the following general formula (1) in a repeating unit constituting a main chain:

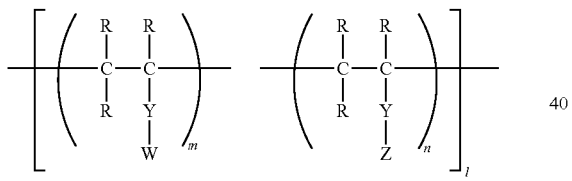

where R's each represent a hydrogen atom, a $C_1$ to $C_{20}$ alkyl group, a $C_1$ to $C_{20}$ alkoxy group, a $C_6$ to $C_{30}$ aryl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, or a $C_3$ to $C_{30}$ cycloalkyl group, and may be identical to or different from each other; Y's each represent a single bond, a $C_1$ to $C_{20}$ alkylene group, a $C_6$ to $C_{30}$ arylene group, a $C_3$ to $C_{30}$ heteroarylene group, CO, COO, or O; Z represents an indolocarbazolyl group substituted at the N-position, and W represents a charge transporting group and is different from Z; m and n represent molar ratios, m represents 0 to 95 mol %, and n represents 5 to 100 mol % relative to 100 mol % of all repeating units; and l represents an average number of repetitions and represents 2 to 10,000.

It is preferred that in the general formula (1), m represent 0 mol %, or that in the general formula (1), m represent 5 to 95 mol %, and n represent 5 to 95 mol %. Further, the polymer for an organic electroluminescent element preferably has a weight-average molecular weight of 1,000 to 1,000,000.

Examples of Z in the general formula (1) include one kind or two or more kinds selected from indolocarbazolyl groups represented by the following formulae (2) to (7):

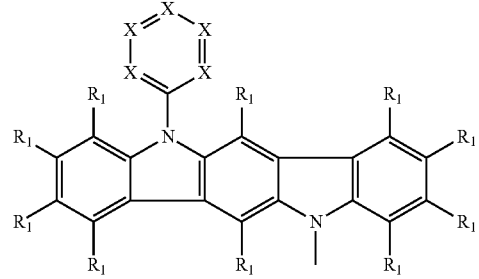

(2)

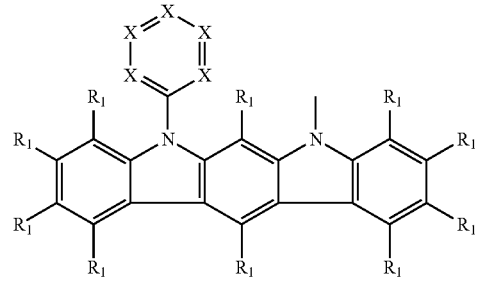

(3)

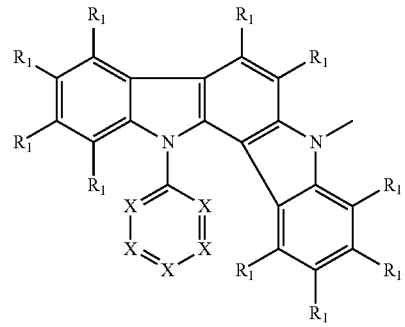

(4)

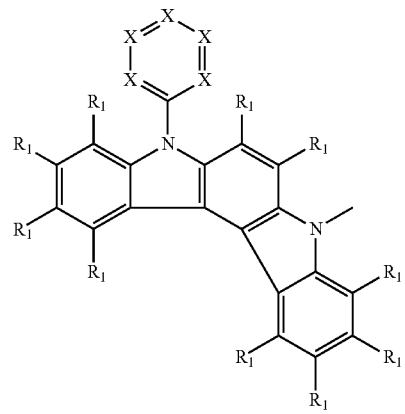

(5)

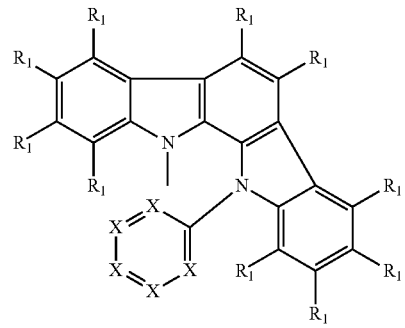

(6)

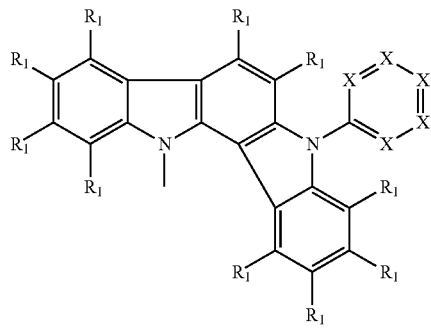

(7)

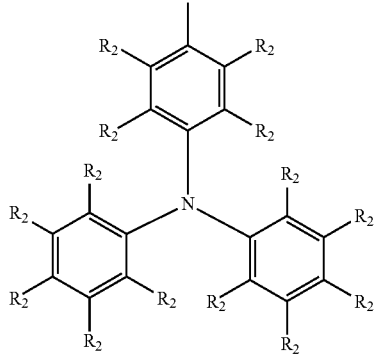

(11)

in the formulae (2) to (7), X's each independently represent C—H, N, or C-L, L independently represents a $C_6$ to $C_{30}$ aryl group, a $C_3$ to $C_{30}$ heteroaryl group, or a $C_{12}$ to $C_{60}$ diarylamino group, $R_1$'s each independently represent a $C_1$ to $C_{20}$ alkyl group, a $C_1$ to $C_{20}$ alkoxy group, a $C_6$ to $C_{30}$ aryl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, or a $C_3$ to $C_{30}$ cycloalkyl group.

Examples of W in the general formula (1) include a charge transporting group represented by the following formula (8) or (9):

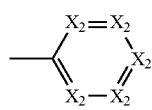

(8)

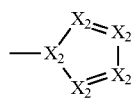

(9)

in the formula (8) or (9), $X_2$'s each independently represent C—H, N, O, S, or C-L; and L independently represents a $C_6$ to $C_{30}$ aryl group, a $C_3$ to $C_{30}$ heteroaryl group, or a $C_{12}$ to $C_{60}$ diarylamino group and may be bonded to a ring including $X_2$'s to form a condensed ring.

Examples of W in the general formula (1) include a charge transporting group represented by the following formula (10) or (11):

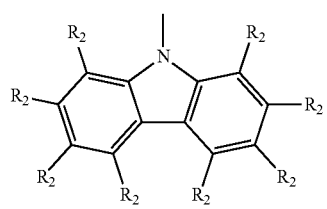

(10)

in the formula (10) or (11), $R_2$'s each represent a hydrogen atom, a $C_1$ to $C_{20}$ alkyl group, a $C_1$ to $C_{20}$ alkoxy group, a $C_6$ to $C_{30}$ aryl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, or a $C_3$ to $C_{30}$ cycloalkyl group, and may be identical to or different from each other.

The present invention also relates to an organic electroluminescent element, including organic layers between an anode layer and a cathode layer laminated on a substrate, in which at least one of the organic layers includes the above-mentioned polymer for an organic electroluminescent element. Examples of the organic layer including the polymer for an organic electroluminescent element include a hole transport layer.

The present invention also relates to a polymer for an organic electroluminescent element, which is represented by the following general formula (12) and has an indolocarbazole skeleton as a pendant in a repeating unit constituting a main chain.

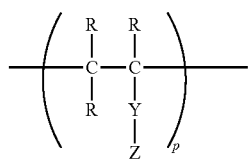

(12)

In the formula, R, Y, and Z have the same meanings as in general formula (1). p has the same meaning as l in the general formula (1).

The present invention also relates to a polymer for an organic electroluminescent element, which is represented by the general formula (1), has an indolocarbazole skeleton as a pendant in a repeating unit constituting a main chain, and has a weight-average molecular weight of 1,000 to 1,000,000. It should be noted that in the general formula (1), m and n represent molar ratios, m represents 5 to 95 mol %, and n represents 5 to 95 mol % relative to 100 mol % of all repeating units. l represents a number of repetitions.

DESCRIPTION OF EMBODIMENTS

Hereinafter, embodiments of the present invention are described in detail. A polymer for an organic electroluminescent element of the present invention is an oligomer or polymer represented by the general formula (1). In this case, the polymer for an organic electroluminescent element of the present invention may be a homopolymer or a copolymer.

It should be noted that the general formula (12) corresponds to the general formula (1) in which m represents 0. R, Y, and Z in the general formula (12) have the same meanings as in the general formula (1), and p corresponds to 1. Therefore, the meanings of the symbols are understood by the description of the general formula (1). The description of the general formula (1) is common to that of the general formula (12), and hence the description of the general formula (1) is made on behalf of the formulae.

In the general formula (1), Z and W represent pendants (side chains). Z represents a group having an indolocarbazole skeleton to be bonded at the N-position, and W represents a charge transporting group. When a unit including Z and a unit including W are represented as Uz and Uw, respectively, the general formula (1) can be represented as the following formula (1A).

$$[(Uw)_m\text{-}(Uz)_n]_l \quad (1A)$$

The polymer for an organic electroluminescent element of the present invention has an indolocarbazole skeleton capable of imparting an excellent charge transporting ability, in particular, a hole transporting ability in a unit which constitutes a main chain as a pendant (side chain). In this case, although the unit which constitutes the main chain means a repeating unit, the repeating unit may include one kind or two or more kinds of units.

In the general formula (1) or the general formula (12), l and p represent numbers of repetitions and vary depending on the weight-average molecular weight. The average (number-average) number of repetitions is 2 to 10,000, preferably 5 to 1,000.

In addition, the polymer for an organic electroluminescent element of the present invention may include a unit or terminal other than the repeating unit represented by the general formula (1), and it is recommended the repeating unit represented by the general formula (1) be included at 50 mol % or more, preferably 80 mol % or more relative to all the repeating units.

In the general formula (1), R's each represent a hydrogen atom, a $C_1$ to $C_{20}$ alkyl group, a $C_1$ to $C_{20}$ alkoxy group, a $C_6$ to $C_{30}$ aryl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, or a $C_3$ to $C_{30}$ cycloalkyl group, and may be identical to or different from each other. When the groups contain a hydrocarbon chain, the hydrocarbon chain may be linear or branched, and may have a halogen such as Cl or F as a substituent. R's each preferably represent a hydrogen atom, a $C_1$ to $C_{12}$ alkyl group, a $C_1$ to $C_{12}$ alkoxy group, a $C_6$ to $C_{24}$ aryl group, a $C_6$ to $C_{24}$ aryloxy group, a $C_7$ to $C_{28}$ arylalkyl group, a $C_7$ to $C_{28}$ arylalkyloxy group, a $C_3$ to $C_{24}$ heteroaryl group, a $C_3$ to $C_{24}$ heteroaryloxy group, or a $C_3$ to $C_{24}$ cycloalkyl group. Each of the unit including Z (Uz) and the unit including W (Uw) includes three R's. Preferably, two or three of the R's represent hydrogen atoms, and more preferably, three of the R's represent hydrogen atoms.

Further, the groups may have substituents, and in the case where the groups have substituents, the above-mentioned numbers of carbon atoms are calculated from carbon atoms in the groups as well as the substituents. The substituents are not particularly limited as far as they do not inhibit performance, but are preferably a $C_1$ to $C_4$ alkyl group, a phenyl group, a pyridyl group, and a carbazolyl group.

Y's each represent a single bond, a $C_1$ to $C_{20}$ alkylene group, a $C_6$ to $C_{30}$ arylene group, a $C_3$ to $C_{30}$ heteroarylene group, CO, COO, or O, preferably a single bond, a $C_6$ to $C_{30}$ arylene group, or a $C_3$ to $C_{30}$ heteroarylene group. When the groups include a hydrocarbon chain, the hydrocarbon chain may be linear or branched, and may have a halogen such as Cl or F as a substituent. Further, the groups may have a substituent, and the substituent is the same as those described for R's above. If Y's each have a longer linking group, the compound has a lower charge transporting ability in the repeating unit and becomes thermally unstable. Therefore, Y's each more preferably represent a single bond.

Z represents an indolocarbazolyl group to be bonded at the N-position. The indolocarbazolyl group is a group obtained by eliminating one hydrogen atom from a five-membered condensed ring compound generated by condensing an indole ring and a carbazole ring and having a substituent at one N-position. The indolocarbazolyl group has two N's, and is preferably an N-substituted indolocarbazolyl group in which one of the N's is bonded to a substituent, and the other one is bonded to a main chain via Y. In addition, the indolocarbazolyl group to be bonded at N-position is also referred to as N-indolocarbazolyl group and may have a substituent on a carbon atom which constitutes the indolocarbazole ring.

The indolocarbazolyl group has a plurality of positions where the indole ring and the carbazole ring can be condensed. Therefore, the indolocarbazolyl group may be a group having six kinds of structural isomers represented by the following formulae (A) to (F), and the group may be any of the structural isomers. In addition, the indolocarbazolyl group preferably has a six-membered aromatic group at the other N-position which is not bonded to the main chain. Further, the indolocarbazole group (including the six-membered aromatic group which is substituted at the other N-position) may have a substituent as far as it does not inhibit the effect of the present invention.

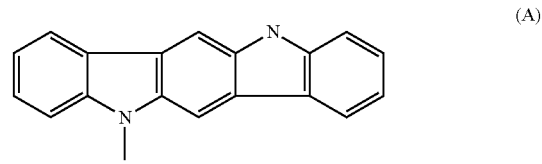

(A)

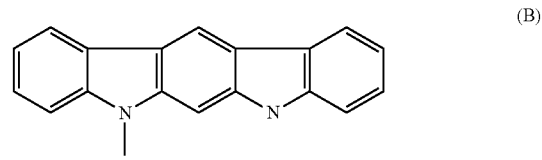

(B)

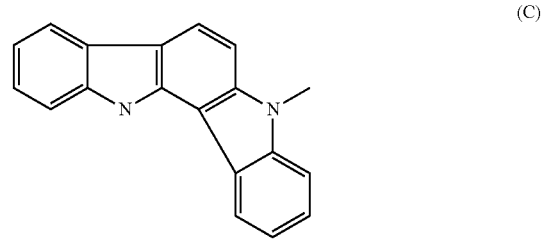

(C)

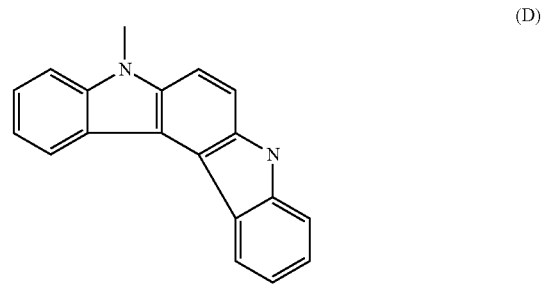

(D)

-continued

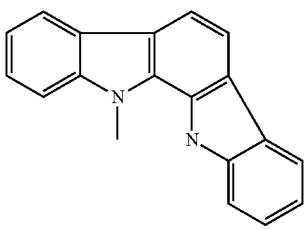

(E)

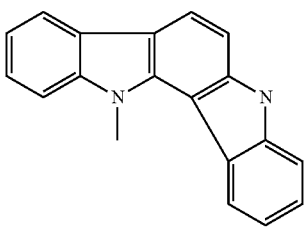

(F)

(In the formulae (A) to (F), only positions where the indolocarbazole skeleton is bonded to the main chain are shown.)

The N-indolocarbazolyl group represented by Z in the general formula (1) includes anyone or two or more of indolocarbazolyl groups selected from the group consisting of structures represented by the above-mentioned formulae (2) to (7). In the case where the N-indolocarbazolyl group includes two or more indolocarbazolyl groups, Z in the general formula (1) includes two or more kinds of indolocarbazolyl groups.

In the formulae (2) to (7), $R_1$'s each independently represent a $C_1$ to $C_{20}$ alkyl group, a $C_1$ to $C_{20}$ alkoxy group, a $C_6$ to $C_{30}$ alyl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, or a $C_3$ to $C_{30}$ cycloalkyl group, and preferably represents a $C_1$ to $C_{20}$ alkyl group, a $C_6$ to $C_{30}$ aryl group, a $C_7$ to $C_{36}$ arylalkyl group, or a $C_3$ to $C_{30}$ heteroaryl group. When the groups contain a hydrocarbon chain, the hydrocarbon chain may be linear or branched, and may have a halogen such as Cl or F as a substituent. In addition, the groups may further have a substituent, and the substituent is the same as those described for R's in the general formula (1).

In the formulae (2) to (7), X's each independently represent any one of C—H, N, and C-L. In this case, L independently represents a $C_6$ to $C_{30}$ aryl group, a $C_3$ to $C_{30}$ heteroaryl group, or a $C_{12}$ to $C_{60}$ diarylamino group, and preferably represents a $C_6$ to $C_{24}$ aryl group, a $C_3$ to $C_{24}$ heteroaryl group, or a $C_{12}$ to $C_{36}$ diarylamino group.

In this case, preferred examples of the aryl group, the heteroaryl group, or an aryl group in the diarylamino group include a group formed by removing a hydrogen atom from benzene, pentalene, indene, naphthalene, azulene, heptalene, octalene, indacene, acenaphthylene, phenalene, phenanthrene, anthracene, trindene, fluoranthene, acephenanthrylene, aceanthrylene, triphenylene, pyrene, chrysene, tetraphene, tetracene, pleiadene, picene, perylene, pentaphene, pentacene, tetraphenylene, cholanthrylene, helicene, hexaphene, rubicene, coronene, trinaphthylene, heptaphene, pyranthrene, ovalene, corannulene, fulminene, anthanthrene, zethrene, terrylene, naphthacenonaphthacene, truxene, furan, benzofuran, isobenzofuran, xanthene, oxathrene, dibenzofuran, peri-xanthenoxanthene, thiophene, thioxanthene, thianthrene, phenoxathiin, thionaphthene, isothianaphtene, thiophthene, thiophanthrene, dibenzothiophene, pyrrole, pyrazole, tellurazole, selenazole, thiazole, isothiazole, oxazole, furazane, pyridine, pyrazine, pyrimidine, pyridazine, triazine, indolizine, indole, isoindole, indazole, purine, quinolizine, isoquinoline, carbazole, indolocarbazole, imidazole, naphthyridine, phthalazine, quinazoline, benzodiazepine, quinoxaline, cinnoline, quinoline, pteridine, phenanthridine, acridine, perimidine, phenanthroline, phenazine, carboline, phenotellurazine, phenoselenazine, phenothiazine, phenoxazine, anthyridine, thebenidine, quindoline, quinindoline, acrindoline, phthaloperine, triphenodithiazine, triphenodioxazine, phenanthrazine, anthrazine, benzothiazole, benzimidazole, benzoxazole, benzisoxazole, benzisothiazole, or an aromatic compound in which a plurality of the aromatic rings are linked to each other, a diphenylamino group, and a dinaphthylamino group. More preferred examples thereof include a group formed by removing a hydrogen atom from benzene, pyridine, pyrazine, pyrimidine, pyridazine, triazine, indole, carbazole, or an aromatic compound in which a plurality of the aromatic rings are linked to each other, and a diphenylamino group. It should be noted that in the case of the group formed from an aromatic compound in which a plurality of the aromatic rings are linked to each other, the number of the aromatic rings to be linked to each other is preferably 2 to 10, more preferably 2 to 5, and the aromatic rings to be linked to each other may be identical to or different from each other.

In addition, the aryl group, the heteroaryl group, or the aryl group in the diarylamino group may have a substituent. When the group has a substituent, the total number of substituents is 1 to 10, preferably 1 to 6, more preferably 1 to 4. It should be noted that the group formed from an aromatic compound in which a plurality of the aromatic rings are linked to each other may also have a substituent. The substituent is not limited, but preferred examples of the substituent include an alkyl group having 1 to 20 carbon atoms, an alkoxy group having 1 to 20 carbon atoms, an alkylthio group having 1 to 20 carbon atoms, an alkyl-substituted amino group having 1 to 20 carbon atoms, an acyl group having 2 to 20 carbon atoms, and a diarylamino group having 12 to 24 carbon atoms. More preferred examples thereof include a methyl group, an ethyl group, an n-propyl group, an i-propyl group, an n-butyl group, a t-butyl group, a methoxy group, an ethoxy group, an n-propoxy group, an i-propoxy group, a phenyl group, a pyridyl group, a diphenylamino group, and a carbazolyl group. When two or more substituents exist, the substituents may be identical to or different from each other.

Further, in the general formula (1), m and n represent molar ratios, and m represents 5 to 95 mol %, and n represents 5 to 95 mol % relative to 100 mol % of all repeating units. m represents preferably 10 to 90 mol %, more preferably 50 to 80 mol %. n represents preferably 10 to 90 mol %, more preferably 20 to 50 mol %. l represents a number of repetitions and varies depending on the weight-average molecular weight. The average (number-average) number of repetitions is 2 to 10,000, preferably 5 to 1,000.

W in the general formula (1) represents a charge transporting group. The charge transporting group includes a hole transporting group and an electron transporting group. The hole transporting group mainly performs transportation of holes, and hence is required to have stability against holes, i.e., oxidation stability, while the electron transporting group mainly performs transportation of electrons, and hence is required to have stability against electrons, i.e., reduction stability. Further, the mobility to the respective charges, that is, hole mobility in the case of the hole transporting group, and electron mobility in the case of the electron transporting group are preferably higher because charges transferred from an adjacent layer such as the hole injection layer can be captured effectively in the light emission layer, resulting in reduction of a driving voltage of the element.

As the hole transporting group, a group including a unit such as carbazole or phenylamine may be used, while as the electron transporting group, a group including an oxadiazole unit, a triazine unit, a triazole unit, or the like may be used. However, in the general formula (1), W is different from Z and hence does not represent an N-substituted indolocarbazolyl group.

Preferred examples of the charge transporting group include a charge transporting group represented by any one of the formulae (8) or (9) and (10) or (11).

In the formula (8) or (9), $X_2$'s each independently represent C—H, N, O, S, or C-L, and L independently represents a $C_6$ to $C_{30}$ aryl group, a $C_3$ to $C_{30}$ heteroaryl group, or a $C_{12}$ to $C_{60}$ diarylamino group and may be bonded to a ring including $X_2$'s to form a condensed ring. In addition, the groups may further have substituents, which are the same as in the description for X's in the general formulae (2) to (7).

In the formula (10) or (11), $R_2$'s each independently represent a hydrogen atom, a $C_1$ to $C_{20}$ alkyl group, a $C_1$ to $C_{20}$ alkoxy group, a $C_6$ to $C_{30}$ aryl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, or a $C_3$ to $C_{30}$ cycloalkyl group. The groups may be identical to or different from each other. When the groups include a hydrocarbon chain, the hydrocarbon chain may be linear or branched. Further, the groups may further have substituents, which are the same as in the description for R's in the general formula (1).

In the general formulae (1) and (12), the repeating unit which forms the main chain is not particularly limited. However, from the viewpoints of easiness of polymerization and improvement of performance of the element, a polymer including, as a repeating unit, an ethylene chain or styrene chain obtained by polymerization or copolymerization of a vinyl compound substituted with the indolocarbazolyl group or the charge transporting group is preferred.

A vinyl compound which provides a unit having the N-indolocarbazolyl group or Uz in the general formula (1) or formula (1A) is exemplified below. The vinyl compounds may be used singly or as a mixture of two or more kinds of the compounds. In addition, the vinyl compound is not limited to the exemplified compounds.

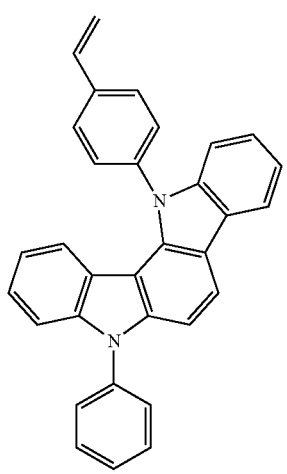

c-1

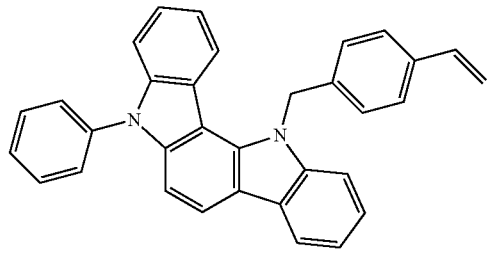

c-2

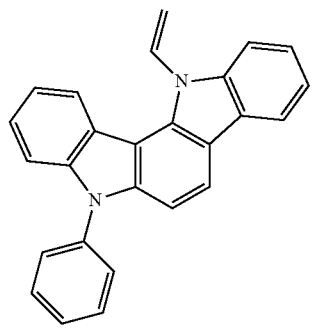

c-3

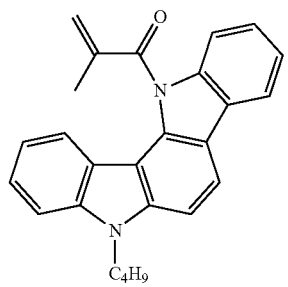

c-4

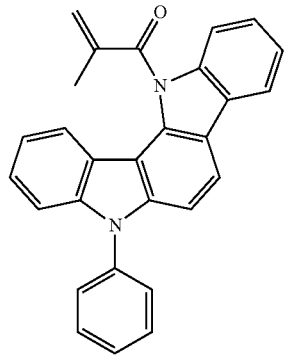

c-5

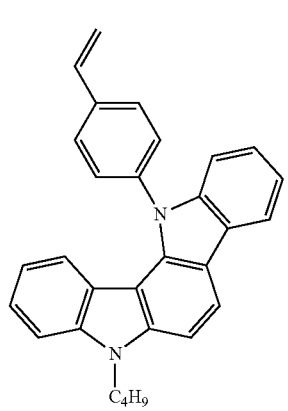

c-6 c-7
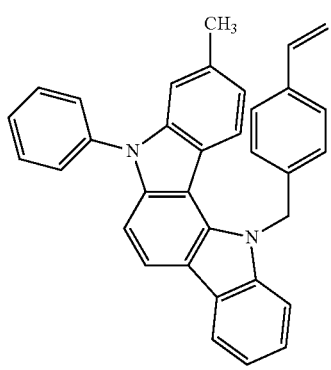
c-8
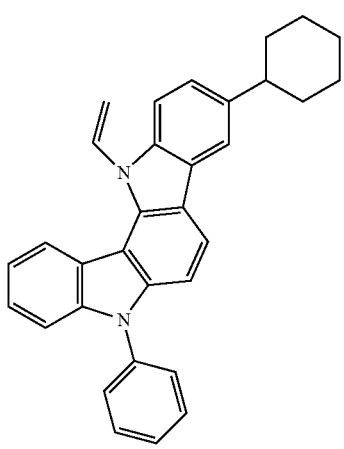
c-9
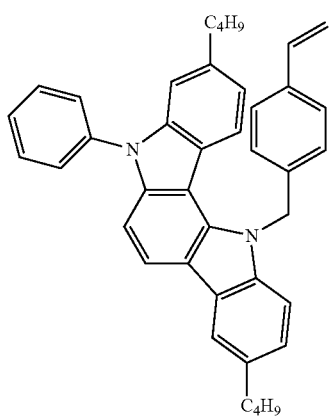
c-10
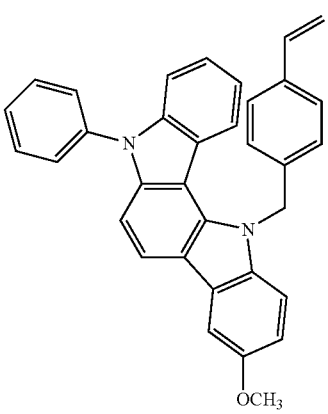
c-11
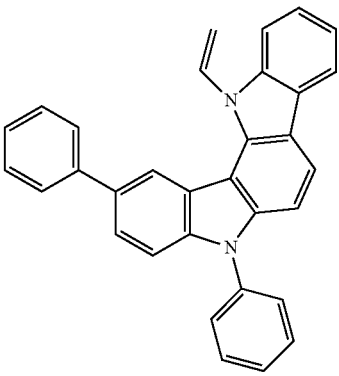
c-12

-continued
c-13
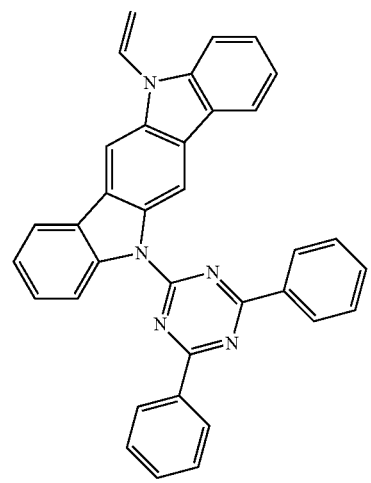
c-14
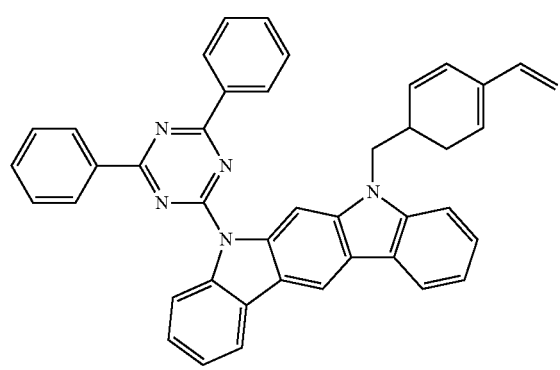
c-15
c-16
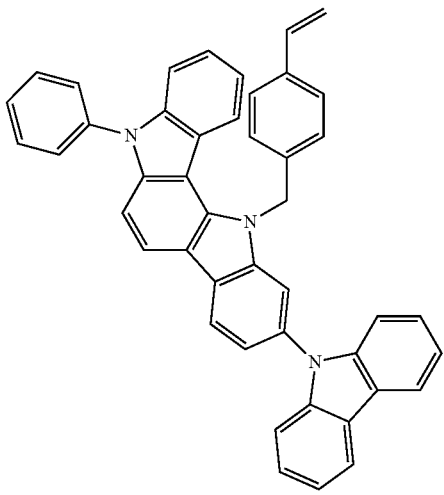
c-17
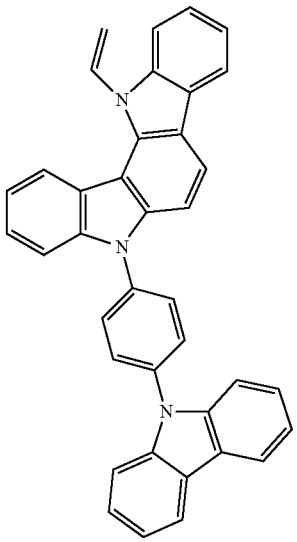
c-18
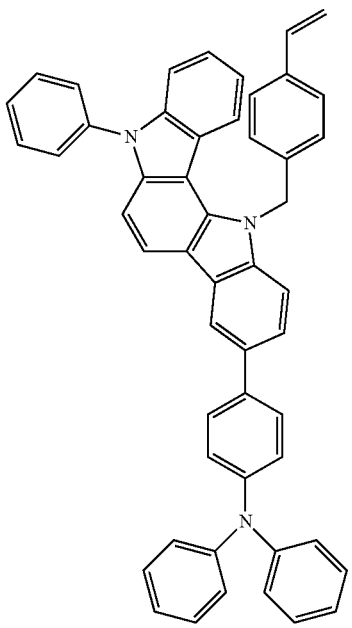

c-19
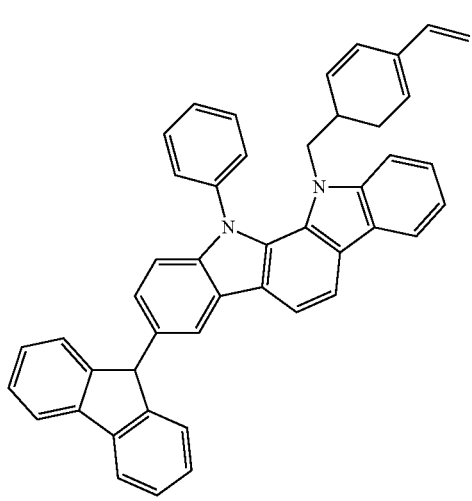
c-22
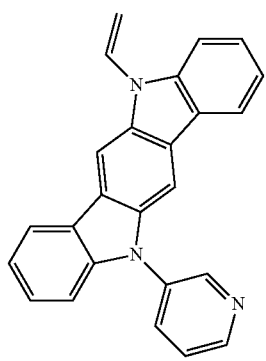
c-20
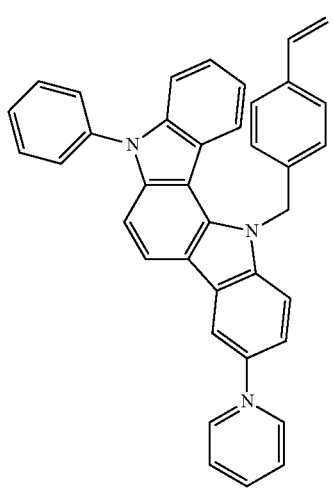
c-23
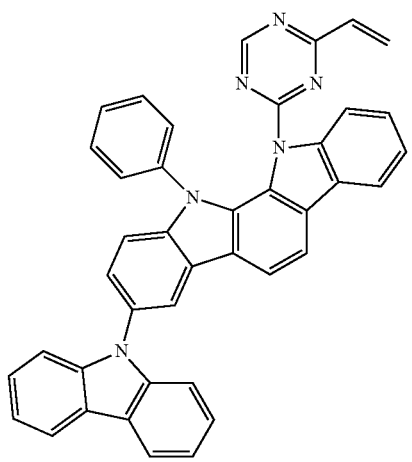
c-21
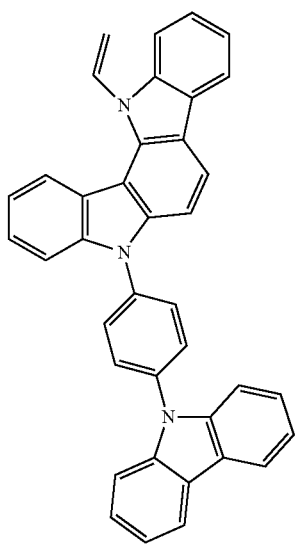
c-24

-continued
c-25
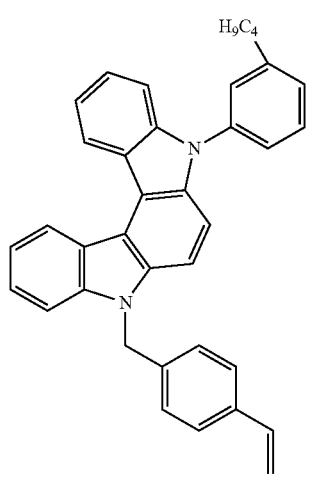
c-28
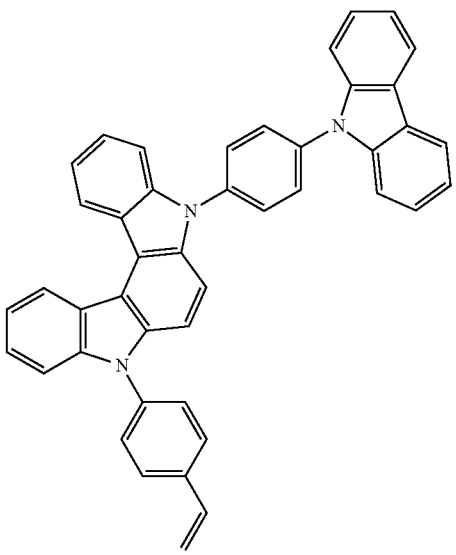
c-26
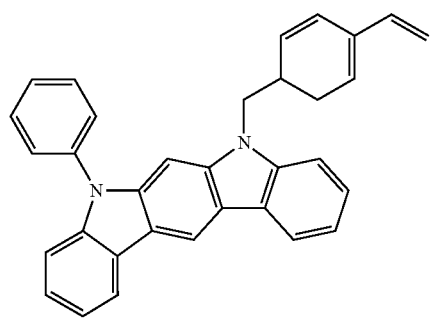
c-29
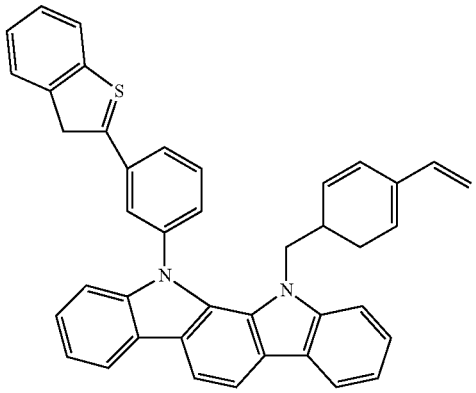
c-27
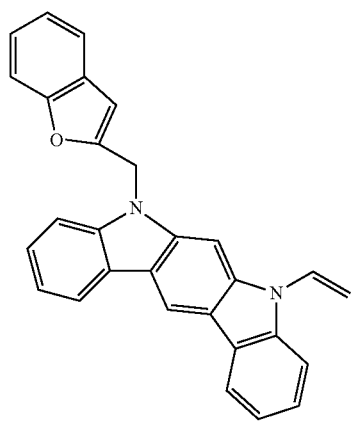
c-30
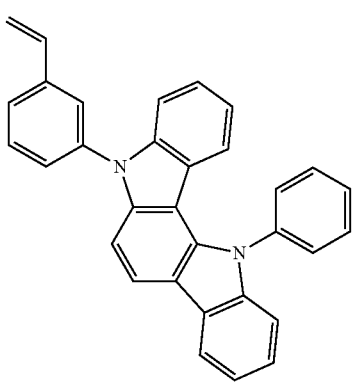

-continued

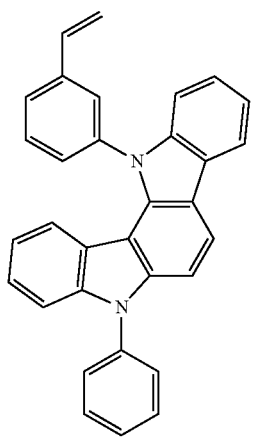
c-31

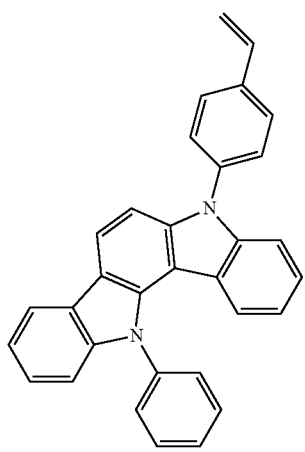
c-32

Next, a vinyl compound which provides a unit having the charge transporting group or Uw in the general formula (1) or formula (1A) is exemplified below. In this case, the vinyl compound substituted with the charge transporting group includes a vinyl compound substituted with the hole transporting group, a vinyl compound substituted with the electron transporting group, and a vinyl compound substituted with both the transporting groups. The vinyl compounds may be used singly or as a mixture of two or more kinds of the compounds. In addition, the vinyl compound is not limited to the exemplified compounds.

m-1

-continued

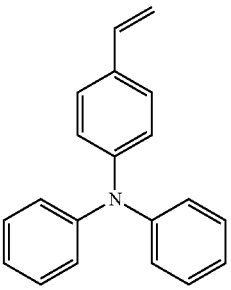
m-2

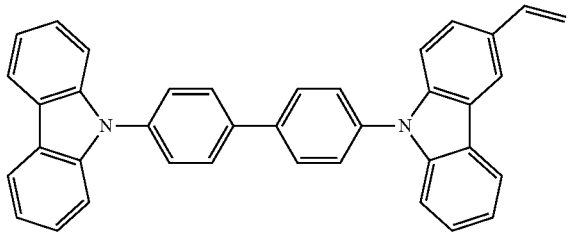
m-3 m-4 m-5 m-6

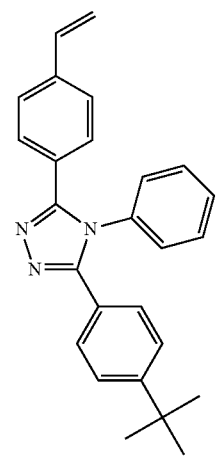

m-7

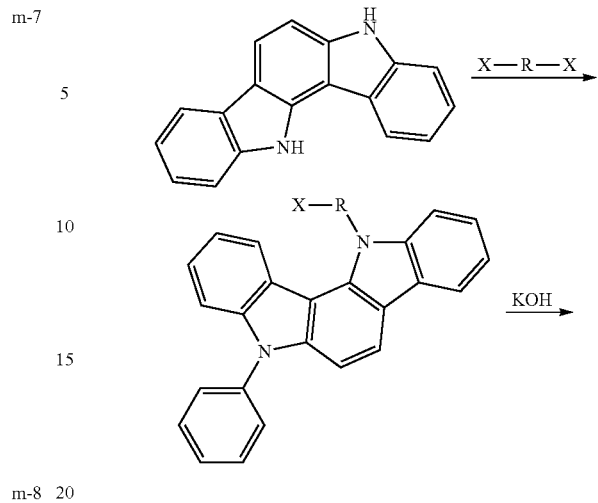

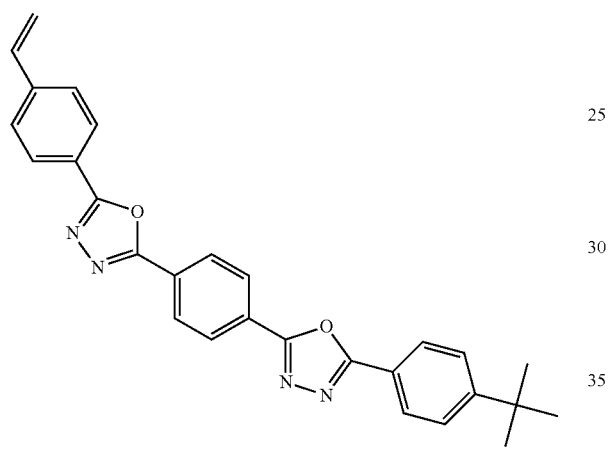

m-8

An indolocarbazole-based polymer for an organic electroluminescent element of the present invention can be easily produced by polymerizing a monomer by a known method. For example, the polymer can be produced according to the following reaction formula. The polymerization method may be any of radical polymerization, anion polymerization, cation polymerization, and addition polymerization, and is desirably radical polymerization from the viewpoint of versatility.

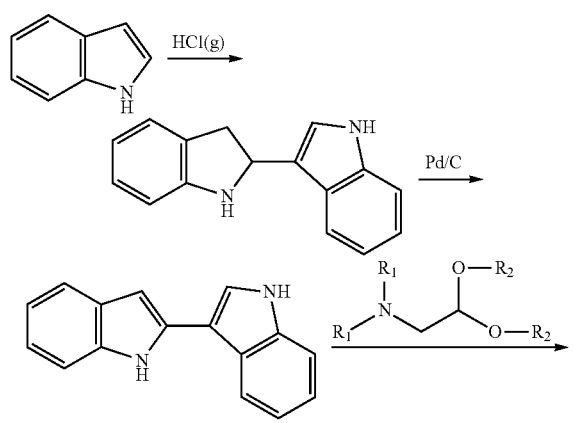

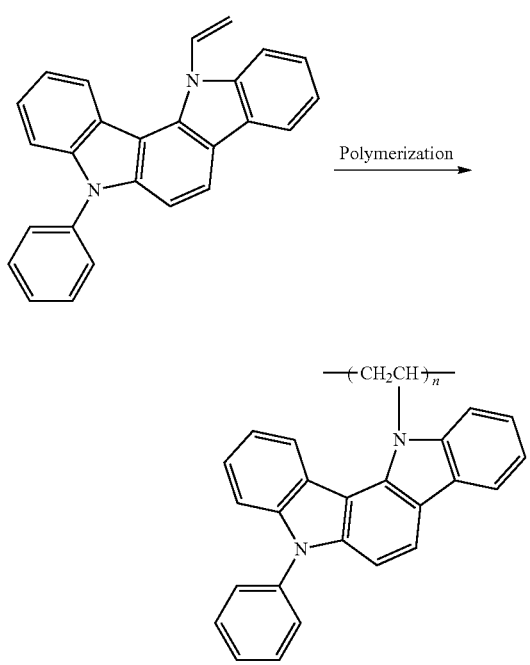

The above-mentioned method is an example of a production method for a polymer obtained by polymerizing a single monomer. As an example of a production method for a polymer obtained by copolymerizing a plurality of monomers, there is given a method involving producing a monomer having the charge transporting group in the same manner as above and copolymerizing the resultant monomer with the above-mentioned monomer.

The indolocarbazole-based polymer of the present invention has a weight-average molecular weight (Mw) of 1,000 to 1,000,000, preferably 5,000 to 300,000. When the Mw is less than 1,000, formation of a uniform film is difficult, while when the Mw is more than 1,000,000, solubility in an organic solvent is extremely low, resulting in difficulty in application of a solution.

Hereinafter, examples of the polymer having an indolocarbazole skeleton of the present invention are shown, but the polymer is not limited thereto.

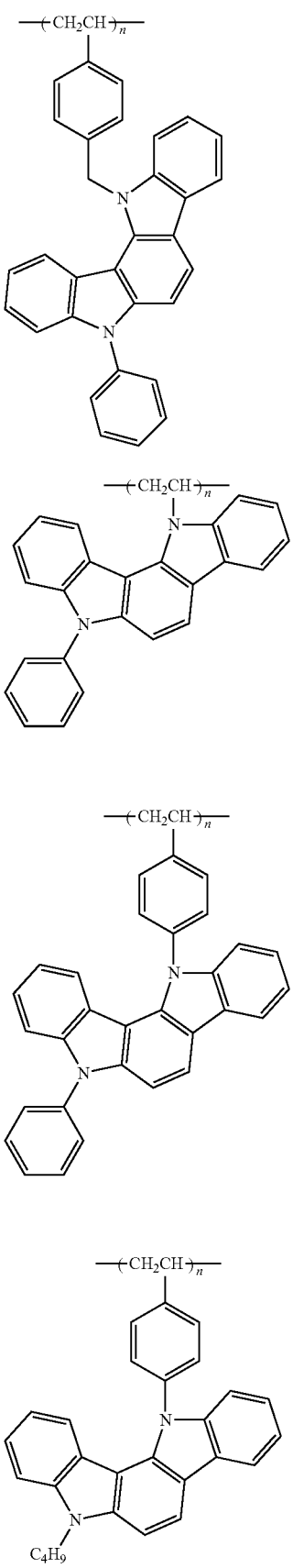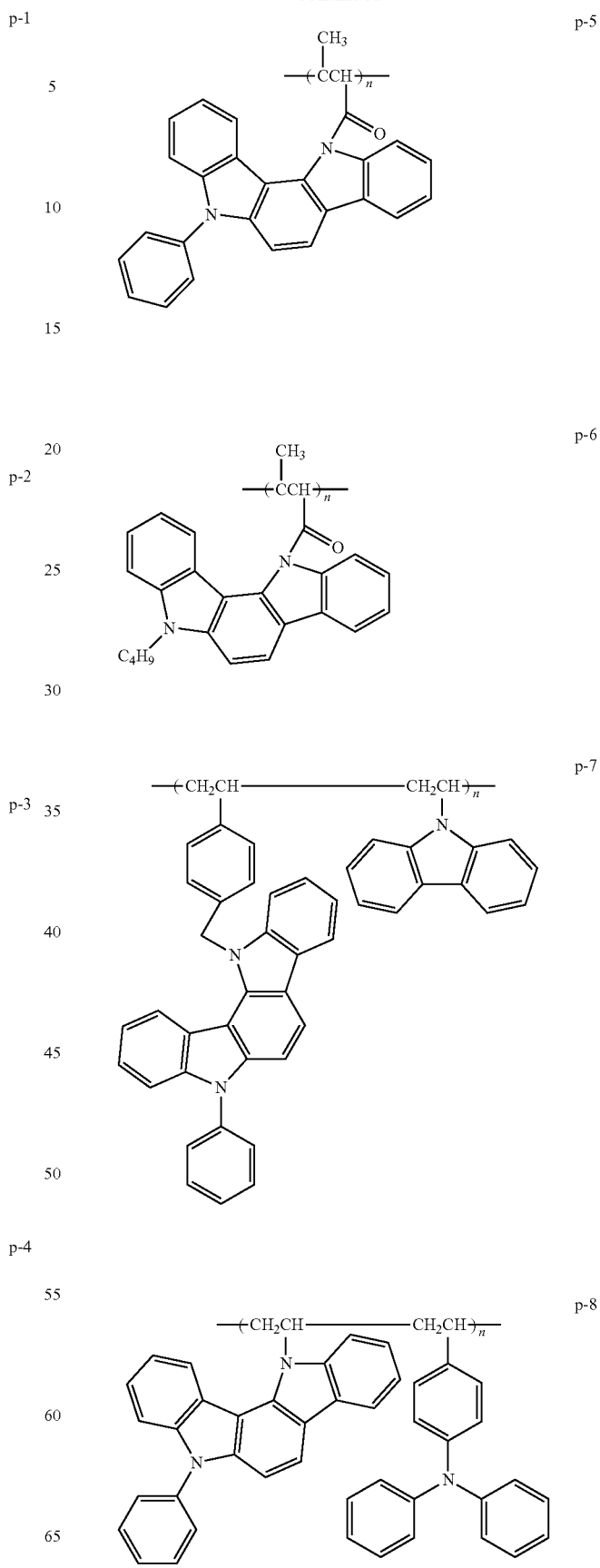

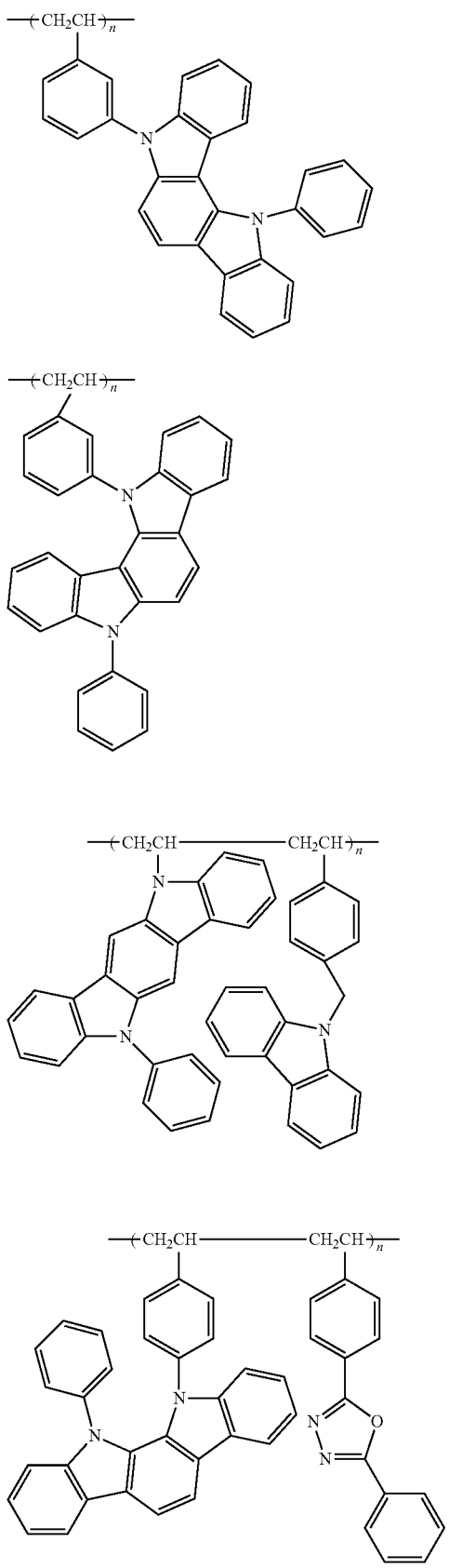

p-9 p-10 p-11 p-12

It should be noted that the polymer for an organic electroluminescent element of the present invention may include a small amount of another repeating unit as far as the effect of the present invention is not inhibited. For example, the polymer may include a small amount of a unit derived from a methacrylate or styrene. Further, in the case where the polymer for an organic electroluminescent element is a copolymer, polymerization may be carried out in a random manner or in a block manner. It should be noted that the copolymers represented by the formulae p-11 and p-12 are shown as alternating copolymers, but may be polymerized in a random manner or in a block manner.

When the polymer for an organic electroluminescent element of the present invention is contained in an organic layer of an organic EL element, an excellent organic electroluminescent element can be provided. The polymer is preferably contained in at least one organic layer selected from a light emission layer, a hole transport layer, an electron transport layer, and a hole blocking element layer. The polymer is more preferably contained as a material for the hole transport layer.

Subsequently, an organic electroluminescent element including the polymer for an organic electroluminescent element of the present invention is described. Hereinafter, the polymer for an organic electroluminescent element of the present invention is also referred to as polymer of the present invention.

The organic electroluminescent element including the polymer of the present invention has a plurality of organic layers between a pair of an anode and a cathode. In particular, the element preferably includes the hole transport layer/light emission layer and electron transport layer, the hole transport layer and light emission layer/electron transport layer, or the hole transport layer/light emission layer/electron transport layer. The element particularly preferably has a layer structure including the hole transport layer/light emission layer/electron transport layer. In addition, the organic electroluminescent element of the present invention may be produced by forming the organic layers and providing protective layers on the respective layers. Further, a protective film may be provided to protect the whole of the element from water or oxygen.

The light emission layer is a layer containing a light emitting material, which may emit fluorescent light or phosphorescent light. In addition, the light emitting material may be used as a dopant, and a host material may be used in combination.

As the light emitting material in the light emission layer, the following compounds may be used as fluorescent light-emitting materials.

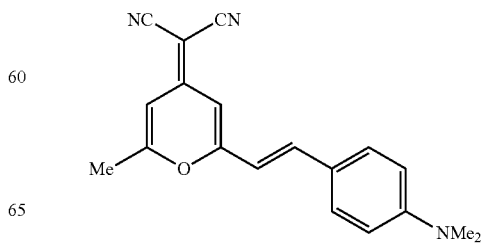

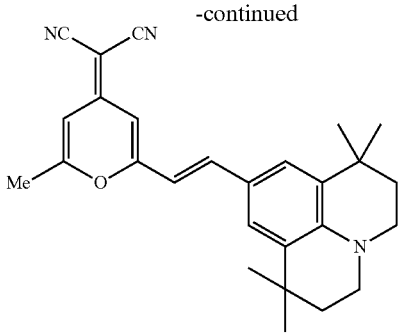

Meanwhile, it is recommended to use, as a phosphorescent light emitting material, a material containing an organic metal complex including at least one metal selected from ruthenium, rhodium, palladium, silver, rhenium, osmium, iridium, platinum, and gold. Such organic metal complex is known in the patent literatures and the like, and it is possible to select and use the complex.

Examples of the phosphorescent light emitting material for providing high light emission efficiency include complexes such as $Ir(ppy)_3$, complexes such as $Ir(bt)_2.acac_3$, and complexes such as $PtOEt_3$, the complexes each having a noble metal element such as Ir as a central metal. Hereinafter, the phosphorescent light emitting material is specifically exemplified below, but is not limited thereto.

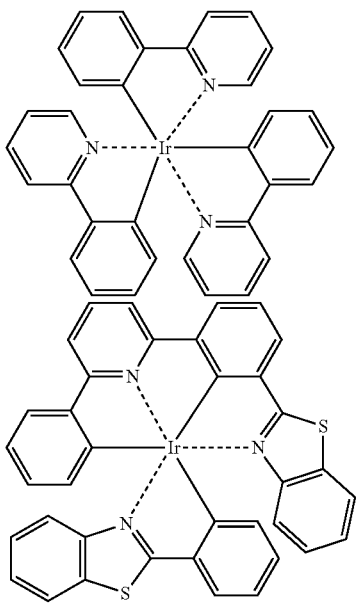

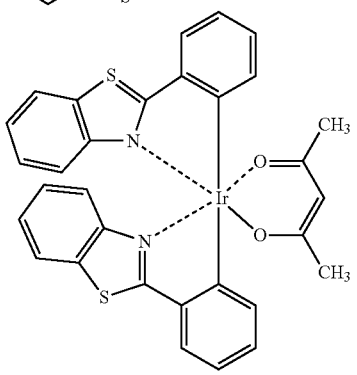

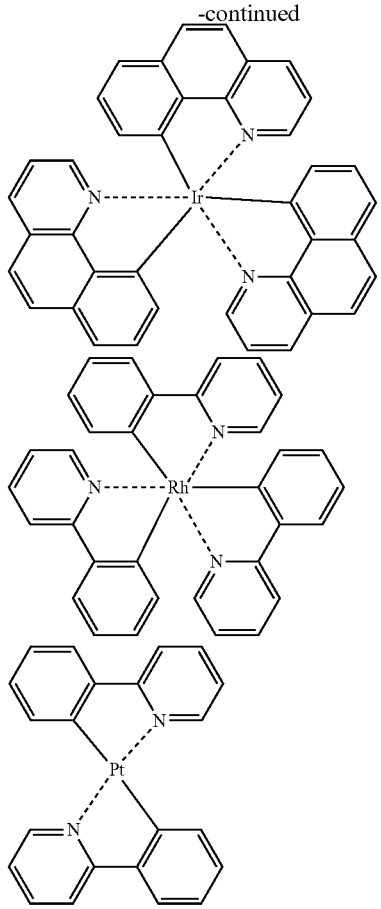

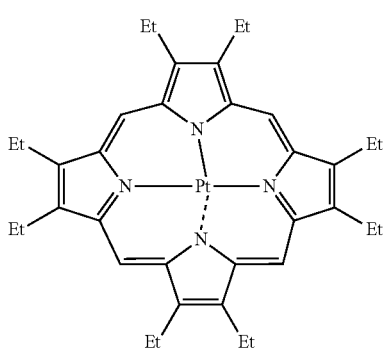

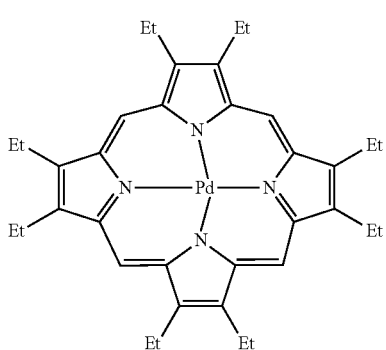

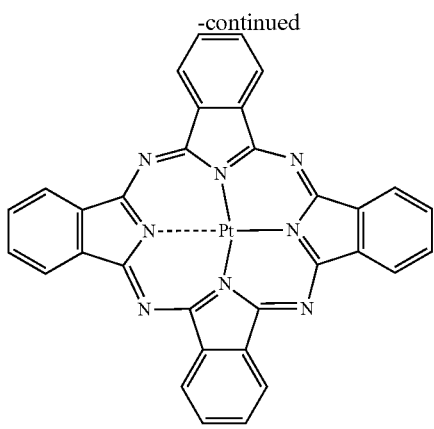

Organic electroluminescent elements having various emission wavelengths may be produced by using different types of light emitting materials.

In the case where the above-mentioned light emitting material is used as a dopant, the amount of the material in the light emission layer falls within the range of preferably 1 to 50 wt %, more preferably 5 to 30 wt %.

As the host material in the light emission layer, a known host material may be used, and the polymer of the present invention may be used as the host material. Further, the polymer of the present invention may be used in combination with another host material.

It is preferred to use, as a usable known host compound, a compound that has a hole transporting ability and an electron transporting ability, is capable of preventing luminescence from having a longer wavelength, and has a higher glass transition temperature.

Such other host materials are known in many patent literatures and the like, and hence a suitable host material may be selected therefrom. Specific examples of the host material include, but not limited to, an indole derivative, a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidene-based compound, a porphyrin-based compound, an anthraquinodimethane derivative, an anthrone derivative, a diphenylquinone derivative, a thiopyran dioxide derivative, a heterocyclic tetracarboxylic acid anhydride such as naphthalene perylene, a phthalocyanine derivative, various metal complexes typified by a metal complex of an 8-quinolinol derivative, a metal phthalocyanine, and metal complexes of benzoxazole and benzothiazole derivatives, and polymer compounds such as a polysilane-based compound, a poly(N-vinylcarbazole) derivative, an aniline-based copolymer, a thiophene oligomer, a polythiophene derivative, a polyphenylene derivative, a polyphenylene vinylene derivative, and a polyfluorene derivative.

As a hole transporting compound which forms the hole transport layer, the polymer for an organic electroluminescent element of the present invention is advantageously used. Examples thereof include a derivative of triphenylamine as a tertiary amine and a carbazole derivative, if necessary, without departing from the object of the invention. One kind or two or more kinds of low-molecular-weight hole transporting compounds may be blended as additives to produce a composition. The hole transporting compound is specifically exemplified below, but is not limited thereto.

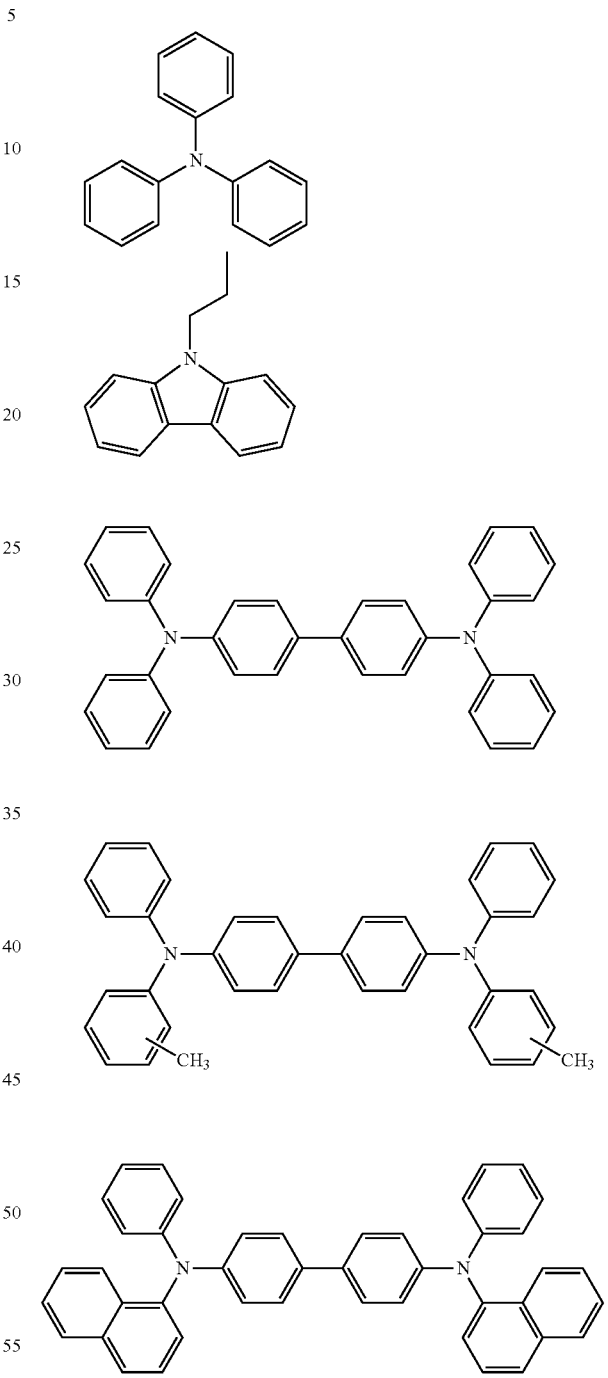

Examples of the electron transporting compound which forms the electron transport layer include an oxadiazole derivative, an imidazole derivative, and a triazole derivative. If necessary, one kind or two or more kinds of low-molecular-weight electron transporting compounds may be blended as additives to produce a composition without departing from the object of the invention. The electron transporting compound is specifically exemplified below, but is not limited thereto.

[化17]

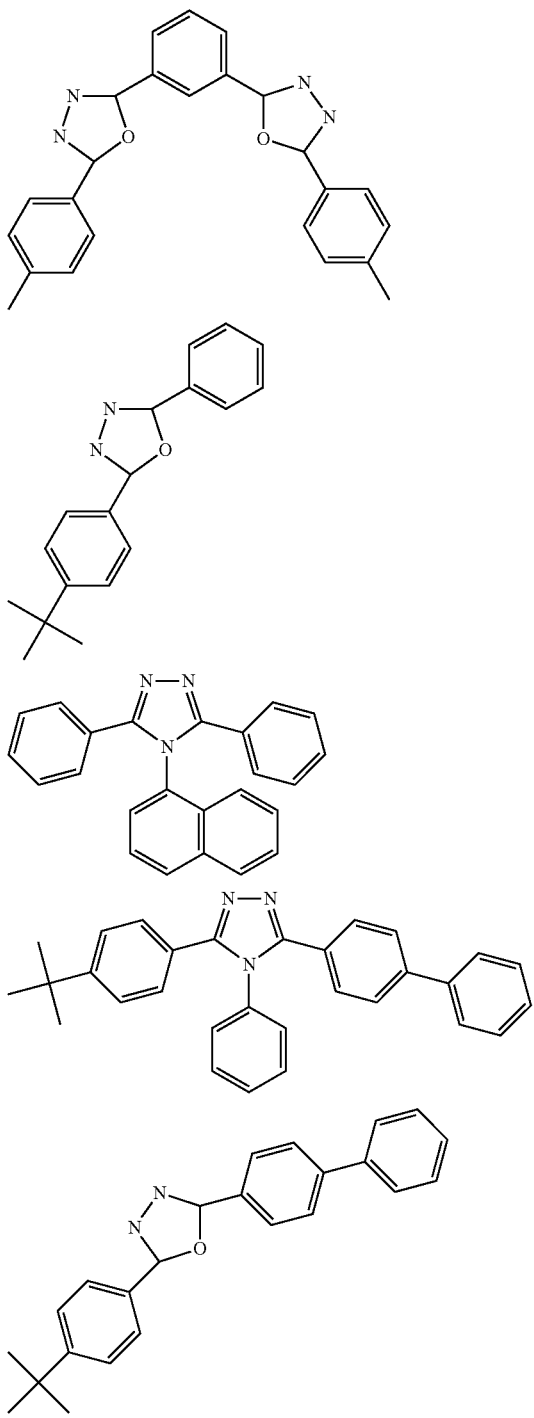

In addition, in order to improve efficiency of hole injection from the anode, the hole injection layer may be inserted between the anode and the hole transport layer or the light emission layer. As a hole injecting material which forms the hole injection layer, a conductive polymer such as a polythiophene derivative or a polypyrrole derivative may be used. Of those, a polythiophene derivative, poly(3,4-ethylenedioxythiophene)/polystyrene sulfonic acid (PEDOT/PSS) is preferred in view of the efficiency of hole injection. In the case of using the hole injection layer, the thickness of the hole injection layer is preferably 200 nm or less, more preferably 100 nm or less.

The anode supplies holes to the hole injection layer, the hole transport layer, the light emission layer, or the like, and is generally formed on a glass substrate. The material for the anode used in the present invention is not particularly limited, and specific examples thereof include a conductive metal oxide such as indium-tin oxide (ITO) or tin oxide, and a metal such as gold, silver, or platinum. Further, a commercially available glass with ITO may be used. The commercially available glass with ITO is usually washed with a cleaner aqueous solution and a solvent, and cleaned by a UV ozone irradiation apparatus or a plasma irradiation apparatus before use.

The cathode supplies electrons to the electron transport layer or the light emission layer. The material for the anode used in the present invention is not particularly limited, and specific examples thereof include a metal such as Li, Mg, Ca, or Al, and an alloy thereof such as an Mg—Ag alloy or an Mg—Al alloy.

The cathode and anode can be formed by a known method, i.e., a vacuum deposition method or a sputtering method. The thickness of the cathode is preferably 300 nm or less, more preferably 200 nm or less, while the thickness of the anode is preferably 200 nm or less, more preferably 100 nm or less.

In general, a spin coating method is used as a method of forming a layer of a polymer such as a polymer light emitting material, a polymer material for the hole transport layer, or a polymer material for the electron transport layer. In addition, as a technology for forming a large-area organic polymer layer, there are given an ink-jet method, a printing method, a spray coating method, and a dispenser method, but the technology is not limited thereto.

EXAMPLES

Hereinafter, the present invention is specifically described by way of examples. However, the present invention is not limited to these examples.

Compounds synthesized in the examples were identified by one kind or two or more kinds of analysis methods selected from $^1$H-NMR (solvent: deuterated chloroform), FD-MS, GPC, TGA, DSC, UV, and IR analyses.

Example 1

A compound (A-2) is synthesized from a compound (A-1), and then a polymer (P-1) is synthesized, according to a scheme (13).

(13)

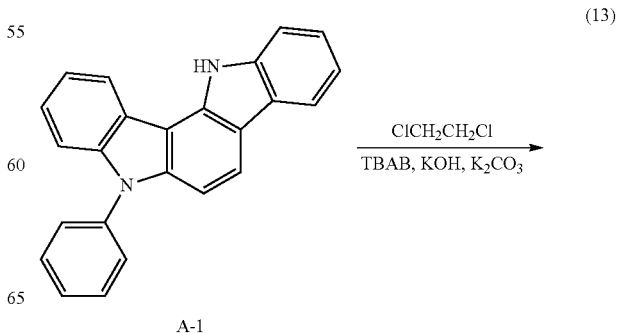

A-1

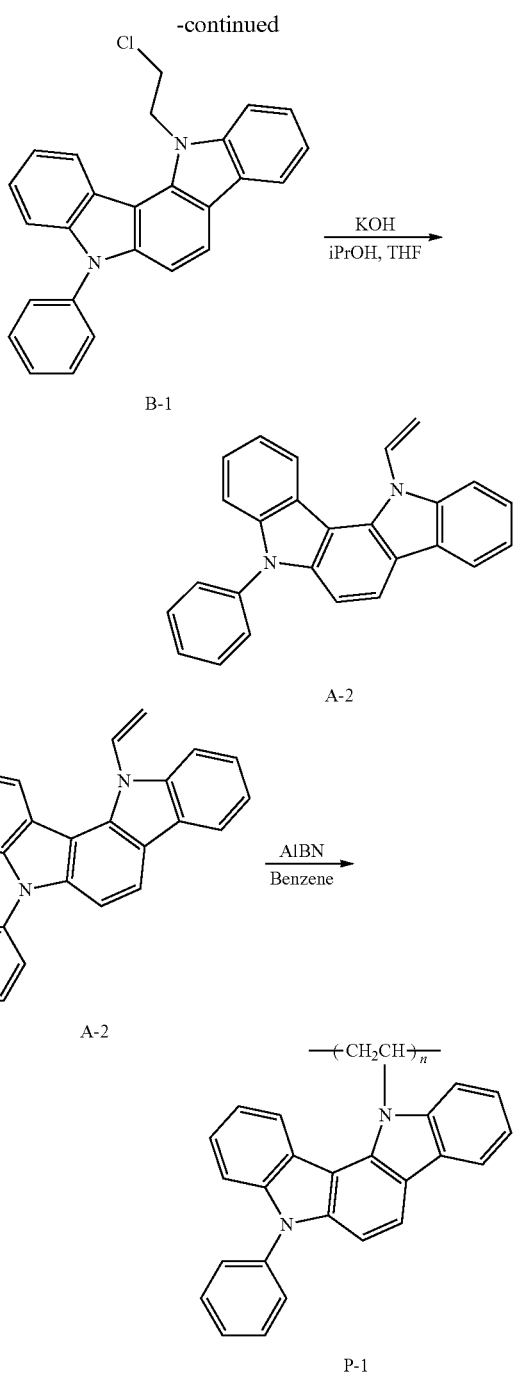

In a nitrogen atmosphere, 30.0 g of 1,2-dichloroethane were added to 2.00 g (6.02 mmol) of the compound (A-1) in a 100-ml recovery flask, and the mixture was stirred at a bath temperature of 50° C. 0.76 g (2.36 mmol) of tetrabutylammonium bromide, 17.56 g (314 mmol) of potassium hydroxide, and 15.8 g (114 mmol) of potassium carbonate were fed in four portions with stirring at a bath temperature of 50° C. for 101 hours. The mixture was cooled to room temperature, and solid matter was separated by filtration. The resultant filtrate was distilled off under reduced pressure. The residue was purified by silica gel column chromatography, to thereby obtain 1.93 g (yield 81%) of a compound (B-1) as white powder.

Subsequently, in a nitrogen atmosphere, 2.59 g (6.56 mmol) of the compound (B-1), 125.0 g of isopropyl alcohol, 50.0 g of tetrahydrofuran (THF), 36 mg (0.33 mmol) of hydroquinone, and 12.5 g (223 mmol) of potassium hydroxide were fed to a 300-ml recovery flask equipped with a Dimroth condenser, and the mixture was refluxed with heating for 23 hours at a bath temperature of 90° C. The mixture was cooled to room temperature, and 200 g of distilled water were added thereto. Isopropyl alcohol and THF were distilled off under reduced pressure. The solution was subjected to extraction with 250 g of dichloromethane four times, and the extract was dried with anhydrous magnesium sulfate. The solid matter was subjected to suction filtration, and the solvent was distilled off under reduced pressure, to thereby obtain 5.48 g of a crude product. The product was purified by silica gel column chromatography and recrystallized twice with dichloromethane/isopropyl alcohol, to thereby obtain 2.10 g (yield 89%) of the compound (A-2).

The $^1$H-NMR and FD-MS spectra of the compound (A-2) are shown below.

$^1$H-NMR (400 MHz, CDCl$_3$): δ (ppm); 8.725 (1H, d, 8 Hz), 8.083 (1H, br d, 8 Hz), 8.066 (1H, d, 8 Hz), 7.861 (1H, dd, 10 and 16 Hz), 7.832 (1H, br d, 8 Hz), 7.657 (2H, t, 8 Hz), 7.598 (2H, d, 8 Hz), 7.542 (1H, t, 8 Hz), 7.448 (1H, t, 8 Hz), 7.398 (2H, m), 7.315 (3H, m), 5.671 (1H, d, 16 Hz), 5.664 (1H, d, 10 Hz)

FD-MS spectrum: 358 (M+, base)

The resultant compound (A-2) was polymerized to synthesize a polymer (P-1). Specifically, 0.5 g (0.17 mmol) of the compound (A-2) was dissolved in 25 ml of benzene, and 0.27 g of AIBN was added thereto as a catalyst. Nitrogen purging was carried out, and the mixture was subjected to a reaction at 70° C. for 17 hours. The reaction liquid was diluted and purified by reprecipitation with acetonitrile. The purified polymer was collected and fed to acetonitrile again to perform reslurrying repetitively, to thereby obtain 0.10 g of the polymer (P-1). The resultant polymer was identified by GPC, TGA, and DSC. The polymer was found to have an Mw in terms of polystyrene of 6,000 as measured by GPC (THF) and a molecular weight distribution of 2.0. In addition, the polymer was found to have a Tg of 221° C. as measured by DSC.

Example 2

An element including the polymer (P-1) obtained in Example 1 was evaluated. First, a film of poly(3,4-ethylenedioxythiophene)/polystyrene sulfonic acid (PEDOT/PSS): (manufactured by H.C. Starck, product name: Clevios PCH8000) was formed as a hole injection layer at a thickness of 25 nm on a glass substrate with ITO having a thickness of 150 nm, which had been washed with a solvent and treated by UV and ozone. Next, the synthesized polymer (P-1) was dissolved in THF to prepare a 0.4 wt % solution, and a film having a thickness of 20 nm was formed as a hole transport layer by a spin coating method. Next, a film of a light emission layer having a thickness of 40 nm was formed by co-evaporation using tris(2-(p-tolyl)pyridine)iridium(III) as a light emission layer dopant and using 4,4'-bis(9H-carbazol-9-yl)biphenyl as a light emission layer host by a vacuum deposition apparatus at a dopant concentration of 0.6 wt %. After that, a film of tris(8-hydroxyquinolinato)aluminum (Alq$_3$) having a thickness of 35 nm and a film of LiF/Al having a thickness of 170 nm as a cathode were formed using the vacuum deposition apparatus. The element was sealed in a glove box, to thereby produce an organic electroluminescent element.

An external power supply was connected to the organic electroluminescent element thus obtained, and a DC voltage of 0 to 10 V was applied thereto. As a result, the element was found to have light emission properties as shown in Table 1 at a current density of 20 mA/cm². It should be noted that the maximum wavelength of the light emission spectrum of the element was 550 nm, and green light emission derived from the iridium complex was observed.

Example 3

The polymer (P-2) was obtained in the same manner as in Example 1 except that the amount of AIBN used as an initiator was changed to 0.12 g, and the amount of benzene used as a solvent was changed to 15 ml in polymerization of the compound (A-2). The polymer was found to have an Mw of 20,000 and a molecular weight distribution of 2.2. In addition, the polymer was found to have a Tg of 214° C. The element was evaluated in the same manner as in Example 2.

Example 4

A compound (A-3) is synthesized from the compound (A-1), and then a polymer (P-3) is synthesized, according to a scheme (14).

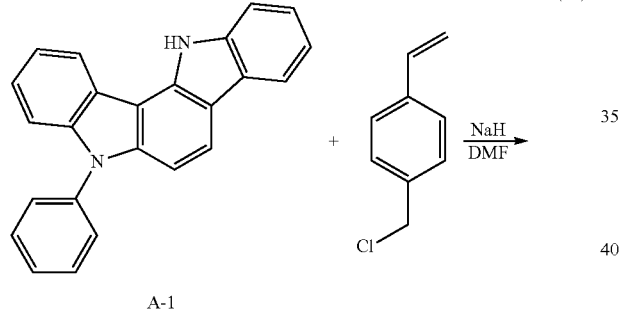

(14)

A-1

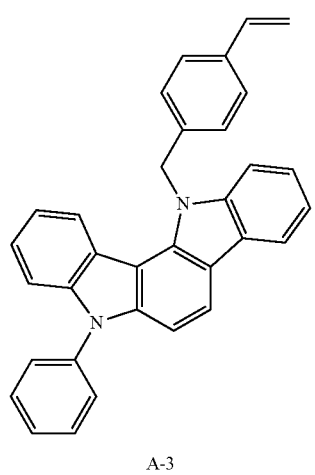

A-3

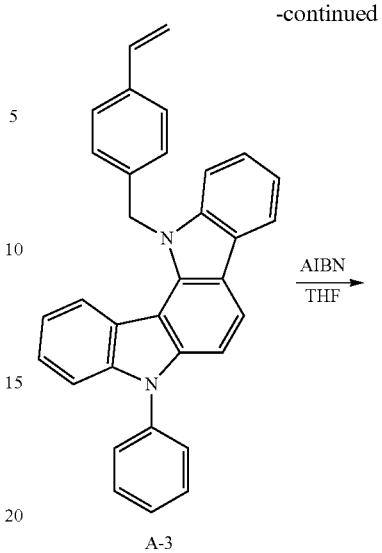

A-3

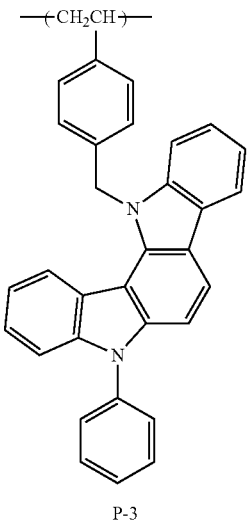

P-3

In a nitrogen atmosphere, 2.00 g (6.02 mmol) of the compound (A-1), 30.0 g of dimethylformamide, and 1.01 g (6.63 mmol) of 4-chloromethylstyrene were fed to a 100-ml recovery flask, and the mixture was stirred at room temperature. 0.46 g (12.05 mmol) of 62.3 wt % sodium hydride was fed thereto in several portions. After completion of feeding, the mixture was stirred for 3 hours. Excess sodium hydride was quenched with a small amount of distilled water, and 100 g of distilled water were further added to the reaction mixture, followed by filtration of the solid matter. The solid matter was recrystallized with THF, to thereby obtain 2.38 g (yield 88%) of the compound (A-3).

The ¹H-NMR and FD-MS spectra of the compound (A-3) are shown below.

¹H-NMR (400 MHz, CDCl₃): δ (ppm); 8.141 (1H, d, 8 Hz), 8.121 (1H, br d, 8 Hz), 8.066 (1H, br d, 8 Hz), 7.655 (2H, m), 7.588 (2H, d, 8 Hz), 7.542 (1H, t, 8 Hz), 7.449 (4H, m), 7.24-7.37 (6H, m), 7.072 (1H, ddd, 2, 7, and 8 Hz), 6.729 (1H, dd, 11 and 18 Hz), 6.136 (2H, s), 5.754 (1H, dd, 1 and 18 Hz), 5.250 (1H, dd, 1 and 11 Hz)

FD-MS spectrum: 448 (M+, base)

0.30 g of the resultant compound (A-3), 30 ml of anhydrous THF as a solvent, and 5.6 mg of AIBN as a catalyst were fed, and polymerization was carried out at 60° C. for 48 hours. The polymerization liquid was purified by recrystallization with acetone, to thereby obtain 0.11 g of the polymer (P-3). The polymer was found to have an Mw of 17,000 and a molecular weight distribution of 2.6. In addition, the polymer was found to have a Tg of 217° C. The element was evaluated in the same manner as in Example 2.

Example 5

A compound (A-4) is synthesized, and then a polymer (P-4) is synthesized, according to a scheme (15).

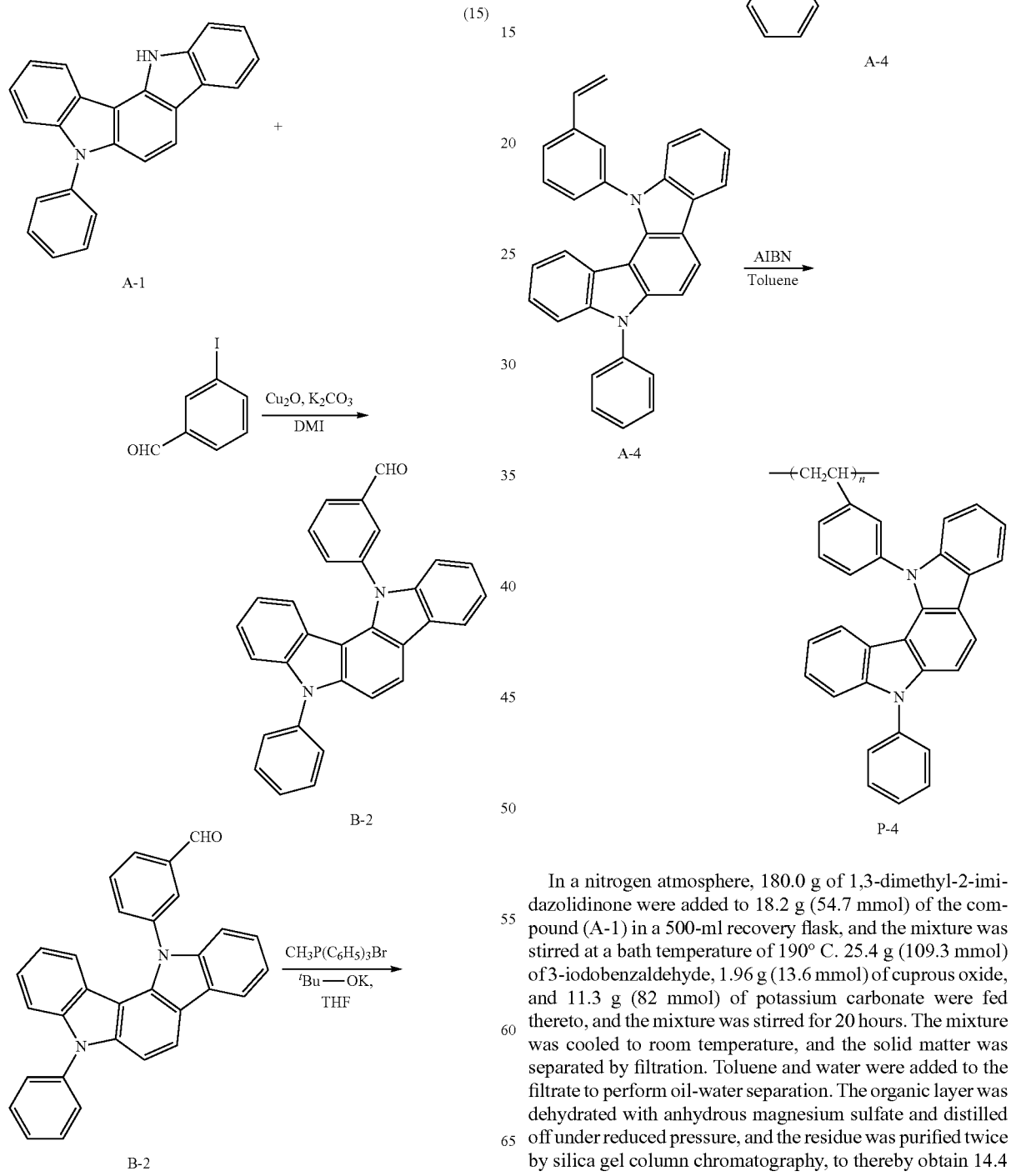

In a nitrogen atmosphere, 180.0 g of 1,3-dimethyl-2-imidazolidinone were added to 18.2 g (54.7 mmol) of the compound (A-1) in a 500-ml recovery flask, and the mixture was stirred at a bath temperature of 190° C. 25.4 g (109.3 mmol) of 3-iodobenzaldehyde, 1.96 g (13.6 mmol) of cuprous oxide, and 11.3 g (82 mmol) of potassium carbonate were fed thereto, and the mixture was stirred for 20 hours. The mixture was cooled to room temperature, and the solid matter was separated by filtration. Toluene and water were added to the filtrate to perform oil-water separation. The organic layer was dehydrated with anhydrous magnesium sulfate and distilled off under reduced pressure, and the residue was purified twice by silica gel column chromatography, to thereby obtain 14.4 g (yield 60%) of a compound (B-2) as white powder.

Subsequently, in a nitrogen atmosphere, 14.2 g (32.6 mmol) of the compound (B-2), 12.2 g (34.2 mmol) of methyltriphenylphosphonium bromide, and 380 ml of anhydrous tetrahydrofuran were added to a 500-ml recovery flask, and the mixture was stirred at room temperature. 30 ml of a solution of 4.0 g (35.8 mmol) of tert-butoxide in anhydrous THF were added dropwise thereto over 20 minutes, and the mixture was further subjected to a reaction for 2 hours at room temperature. The resultant mixture was transferred to a 2-L recovery flask, and 400 ml of water were fed thereto. THF was distilled off, and dichloromethane was added thereto to perform oil-water separation. The organic layer was dehydrated with anhydrous magnesium sulfate and distilled off under reduced pressure. The residue was purified twice by silica gel column chromatography, to thereby obtain 7.2 g (yield 51%) of a compound (A-4) as white powder.

The $^1$H-NMR and FD-MS spectra of the compound (A-4) are shown below.

$^1$H-NMR (400 MHz, CDCl$_3$): δ (ppm); 8.171 (1H, d, 8 Hz), 8.152 (1H, dd, 8 and 1 Hz), 7.54-7.72 (6H, m), 7.51-7.54 (2H, m), 7.16-7.35 (1H, 7H, m), 6.807 (1H, dd, 17 and 11), 6.803 (1H, dt, 1 and 8 Hz), 6.056 (1H, d, 8 Hz), 5.811 (1H, d, 17 Hz), 5.329 (1H, d, 11 Hz)

FD-MS spectrum: 434 (M+, base)

1.21 g of the polymer (P-4) were obtained by polymerization and aftertreatment in the same manner as in Example 1 except that 2.5 g of the compound (A-4), 10 ml of anhydrous toluene, and 34.1 mg of AIBN as a catalyst were used, and the polymerization time was changed to 20 hours. The polymer was found to have an Mw of 13,000 and a molecular weight distribution of 2.1. In addition, the polymer was found to have a Tg of 262° C. The element was evaluated in the same manner as in Example 2.

Example 6

A compound (A-5) is synthesized, and then a polymer (P-5) is synthesized, according to a scheme (16)

(16)

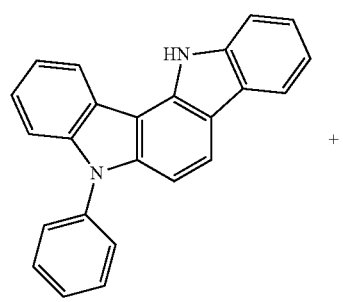

A-1

+

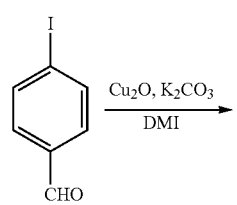

Cu$_2$O, K$_2$CO$_3$ / DMI

-continued

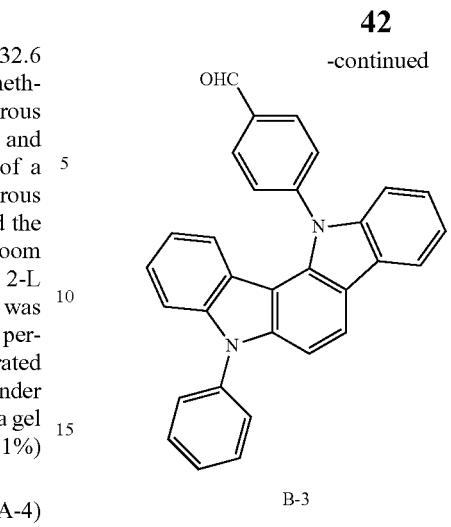

B-3

CH$_3$P(C$_6$H$_5$)$_3$Br, $^t$Bu—OK, THF

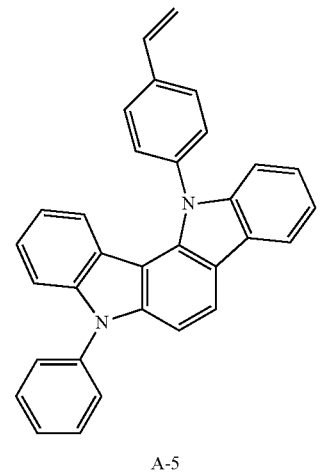

A-5

AIBN / Toluene

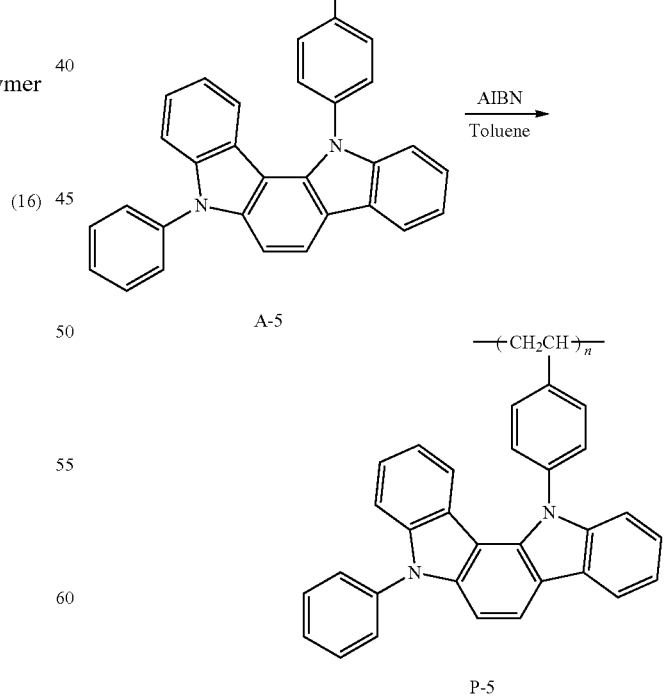

P-5

3.2 g (yield 71%) of the compound (A-5) as white powder were obtained by reaction and aftertreatment in the same manner as in Example 5 except that 6.4 g (19.3 mmol) of the compound (A-1) and 8.8 g (38.3 mmol) of 4-iodobenzaldehyde were used.

The $^1$H-NMR and FD-MS spectra of the compound (A-2) are shown below.

$^1$H-NMR (400 MHz, CDCl$_3$), δ (ppm); 8.165 (1H, d, 8 Hz), 8.148 (1H, dt, 7 and 1 Hz), 7.702 (2H, br d, 8 Hz), 7.58-7.67 (6H, m), 7.529 (1H, tt, 7 and 2 Hz), 7.28-7.36 (5H, m), 7.225 (1H, ddd, 8, 7, and 1 Hz), 6.930 (1H, dd, 18 and 11 Hz), 6.817 (1H, ddd, 8, 7, and 1 Hz), 6.126 (1H, br d, 8 Hz), 5.931 (1H, dd, 18 and 1 Hz), 5.434 (1H, dd, 11 and 1 Hz)

FD-MS specrum: 434 (M+, base)

1.13 g of the polymer (P-5) were obtained by polymerization and aftertreatment in the same manner as in Example 1 except that 2.0 g of the compound (A-5), 20 ml of anhydrous toluene, and 25.6 mg of AIBN as a catalyst were used, and the polymerization time was changed to 28 hours. The polymer was found to have an Mw of 11,000 and a molecular weight distribution of 1.9. In addition, the polymer was found to have a Tg of 275° C. The element was evaluated in the same manner as in Example 2.

Example 7

A compound (A-7) is synthesized, and then a polymer (P-6) is synthesized, according to a scheme (17)

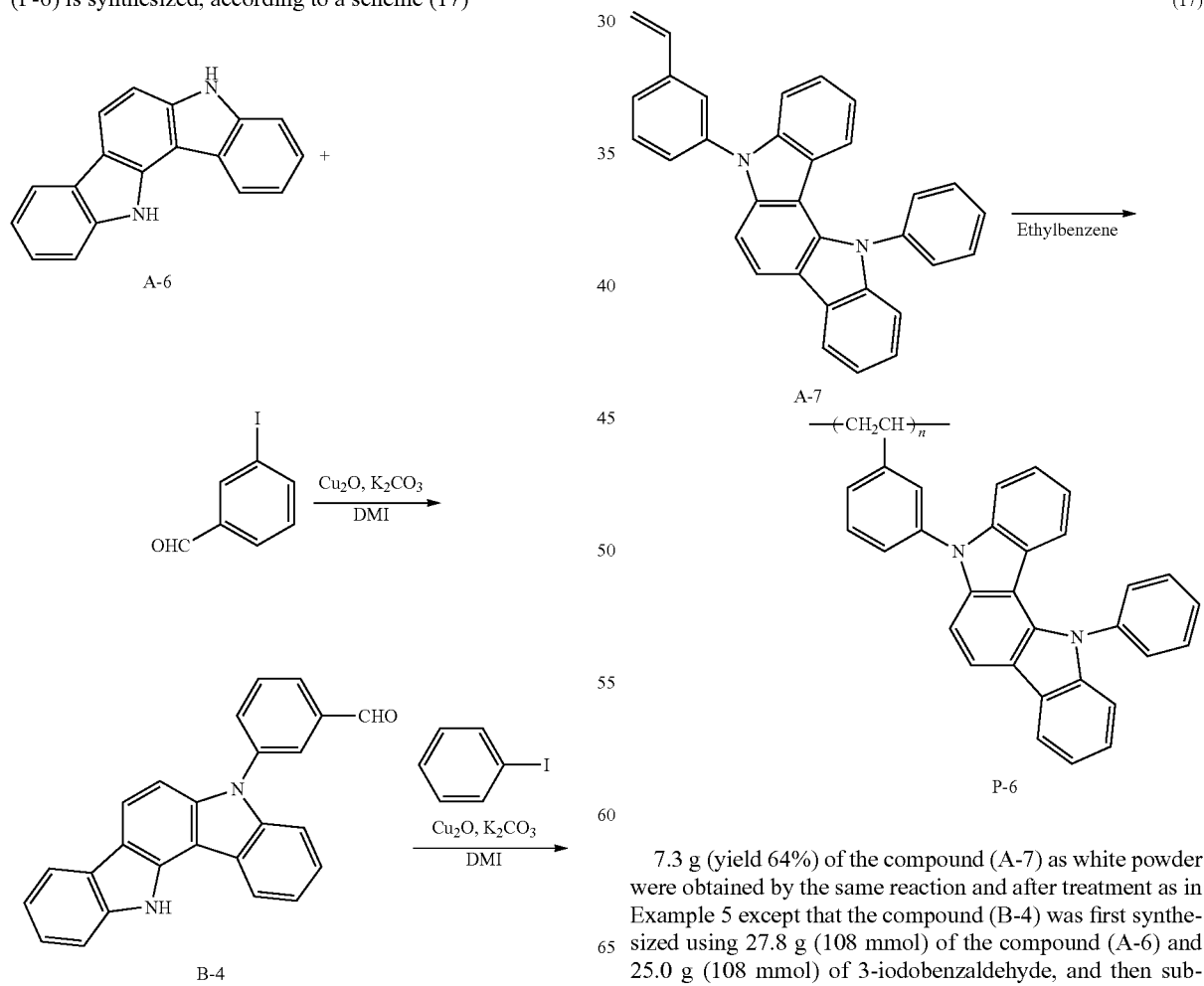

7.3 g (yield 64%) of the compound (A-7) as white powder were obtained by the same reaction and after treatment as in Example 5 except that the compound (B-4) was first synthesized using 27.8 g (108 mmol) of the compound (A-6) and 25.0 g (108 mmol) of 3-iodobenzaldehyde, and then subjected to a reaction with 48.7 g (239 mmol) of iodobenzene.

The ¹H-NMR and FD-MS spectra of the compound (A-7) are shown below.

¹H-NMR (400 MHz, CDCl₃), δ (ppm); 8.171 (1H, d, 9 Hz), 8.149 (1H, dd, 8 and 2 Hz), 7.55-7.66 (8H, m), 7.469 (1H, dt, 8 and 2 Hz), 7.28-7.38 (5H, m), 7.222 (1H, ddd, 8, 7, and 1 Hz), 6.808 (1H, dd, 11 and 18 Hz), 6.789 (ddd, 8, 7, and 1 Hz), 5.940 (1H, dd, 8 and 1 Hz), 5.831 (1H, dd, 18 and 1 Hz), 5.355 (1H, d, 11 Hz)

FD-MS spectrum: 434 (M+, base)

1.2 g of the compound (A-7) and 1 ml of ethyl benzene were added to a 25-ml recovery flask, and degassing and nitrogen purging of the resultant mixed liquid were repeated, followed by polymerization at a bath temperature of 125° C. for 65 hours. The polymerization liquid was diluted and purified by reprecipitation with methanol. The purified polymer was collected and fed to methanol again to perform reslurrying repetitively, to thereby obtain 0.54 g of the polymer (P-6). The polymer was found to have an Mw of 300,000 and a molecular weight distribution of 2.3. In addition, the polymer was found to have a Tg of 280° C. The element was evaluated in the same manner as in Example 2.

Comparative Example 1

A compound (B-6) is synthesized from 4-(diphenylamino) benzaldehyde, and then a polymer (EP-1) is synthesized, according to a scheme (18).

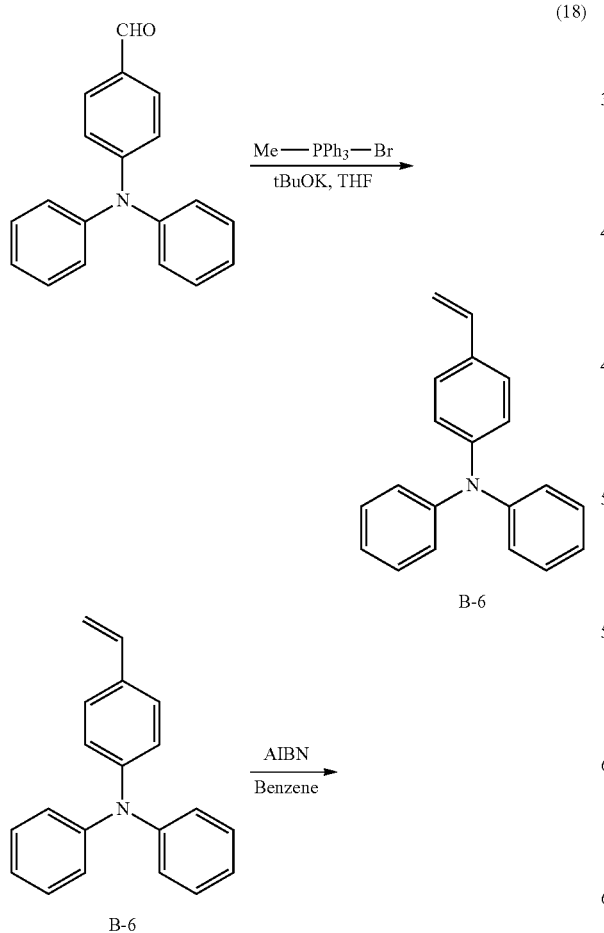

B-6

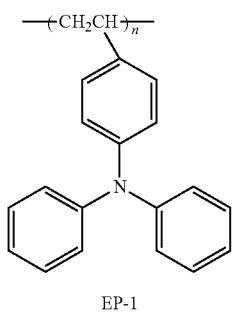

EP-1

In a nitrogen atmosphere, a solution of 4.52 g of potassium t-butoxide in anhydrous THF was added dropwise to a mixed liquid including 10.00 g of 4-(diphenylamino)benzaldehyde, 13.71 g of methyltriphenylphosphonium bromide, and 250 ml of anhydrous THF, and the mixture was stirred for 5 hours at room temperature. 200 g of distilled water were added to the reaction mixed liquid, and THF was distilled off under reduced pressure. The solution was subjected to extraction twice with 200 g of diethyl ether, and the extract was dried with anhydrous magnesium sulfate. The solid matter was subjected to suction filtration, and the solvent was distilled off under reduced pressure, to thereby obtain 12.8 g of a crude product. The product was purified by silica gel column chromatography and recrystallized with hexane, to thereby obtain 6.26 g (yield 63%) of the compound (B-6).

The ¹H-NMR and FD-MS spectra of the compound (B-6) are shown below.

¹H-NMR (400 MHz, CDCl₃): δ (ppm); 7.287 (2H, d, 8 Hz), 7.237 (2H, d, 8 Hz), 7.249 (2H, t, 8 Hz), 7.090 (4H, d, 8 Hz), 7.016 (4H, t, 8 Hz), 6.661 (1H, dd, 11 and 18 Hz), 5.637 (1H, dd, 1 and 18 Hz), 5.155 (1H, dd, 1 and 11 Hz)

FD-MS spectrum: 271 (M+, base)

The polymerization and aftertreatment were carried out in the same manner as in Example 1 except that the compound (B-6) was used as a monomer. The resultant polymer (EP-1) was found to have an Mw of 29,000 and a molecular weight distribution of 2.3. In addition, the polymer was found to have a Tg of 137° C. The element was evaluated in the same manner as in Example 2.

Comparative Example 2

The polymerization and aftertreatment were carried out in the same manner as in Example 1 except that 4-(N-carbazyl) methylstyrene was used as a monomer. The resultant 4-(N-carbazyl)methylstyrene polymer (polymer (EP-2)) was found to have an Mw of 11,000 and a molecular weight distribution of 2.0. In addition, the polymer was found to have a Tg of 148° C. The element was evaluated in the same manner as in Example 2.

Table 1 shows the polymers used for evaluation of the elements and the results of the evaluation. All the polymers are ones used in the hole transport layers. The luminance shown in Table 1 was measured at 20 mA/cm². It should be noted that the maximum wavelength of the light emission spectrum of the element was 550 nm, and green light emission derived from the iridium complex was observed.

TABLE 1

|  | Polymer | Mw (×10⁴) | Tg (° C.) | Luminance (cd/m²) | Voltage (V) |
|---|---|---|---|---|---|
| Example 2 | P-1 | 6,000 | 221 | 10,200 | 7.4 |
| Example 3 | P-2 | 20,000 | 214 | 9,700 | 7.2 |
| Example 4 | P-3 | 17,000 | 217 | 8,800 | 7.9 |
| Example 5 | P-4 | 13,000 | 262 | 10,000 | 8.0 |
| Example 6 | P-5 | 11,000 | 275 | 9,600 | 8.2 |
| Example 7 | P-6 | 300,000 | 280 | 12,500 | 7.6 |
| Comparative Example 1 | EP-1 | 29,000 | 137 | 7,200 | 7.1 |
| Comparative Example 2 | EP-2 | 11,000 | 148 | 6,700 | 8.6 |

Example 8

The compound (A-2) and the compound (B-6) obtained in Synthesis Example 6 were copolymerized to synthesize a copolymer (CP-1). Specifically, as shown in a scheme (19), 0.36 g (1.0 mmol) of the compound (A-2) and 0.07 g (0.25 mmol) of the compound (B-6) were dissolved in 20 ml of benzene, and 4.7 mg of AIBN were added thereto as a catalyst. After nitrogen purging, the mixture was subjected to a reaction at 70° C. for 16 hours. The reaction liquid was diluted and purified by reprecipitation with acetonitrile.

The purified polymer was collected and fed to acetonitrile again to perform reslurrying repetitively, to thereby obtain 0.14 g of the polymer (CP-1). The resultant polymer was identified by GPC, TGA, and DSC. The polymer was found to have an Mw in terms of polystyrene of 9,000 as measured by GPC (THF) and a molecular weight distribution of 2.2. The ratio of the repeating unit derived from the compound (A-2) to the repeating unit derived from the compound (B-6) in the polymer (CP-1) was determined by $^1$H-NMR and was found to be (A-2)/(B-6)=72/28 (mol/mol). In addition, the polymer was found to have a Tg of 193° C. as measured by DSC.

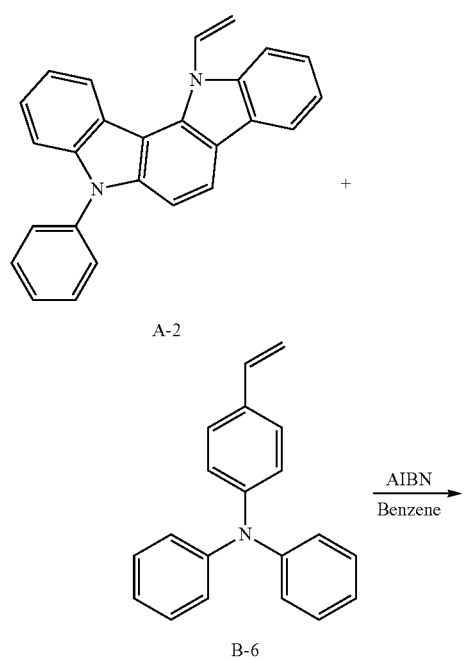

(19)

Example 9

An element including the polymer (CP-1) obtained in Example was evaluated as described below. First, a film of poly(3,4-ethylenedioxythiophene)/polystyrene sulfonic acid (PEDOT/PSS): (manufactured by H.C. Starck, product name: Clevios PCH8000) was formed as a hole injection layer at a thickness of 40 nm on a glass substrate with ITO having a thickness of 150 nm, which had been washed with a solvent and treated by UV and ozone. Next, the synthesized polymer (CP-1) was dissolved in THF to prepare a 0.4 wt % solution, and a film having a thickness of 20 nm was formed as a hole transport layer by a spin coating method. Next, a film of a light emission layer having a thickness of 40 nm was formed by co-evaporation using tris(2-(p-tolyl)pyridine)iridium(III) as a light emission layer dopant and using 4,4'-bis(9H-carbazol-9-yl)biphenyl as a light emission layer host by a vacuum deposition apparatus at a dopant concentration of 0.6 wt %. After that, a film of Alq$_3$ having a thickness of 25 nm and a film of LiF/Al having a thickness of 170 nm as a cathode were formed using the vacuum deposition apparatus. The element was sealed in a glove box, to thereby produce an organic electroluminescent element.

An external power supply was connected to the organic electroluminescent element thus obtained, and a DC voltage of 0 to 10 V was applied thereto. As a result, the element was found to have light emission properties as shown in Table 2 at a current density of 20 mA/cm². It should be noted that the maximum wavelength of the light emission spectrum of the element was 550 nm, and green light emission derived from the iridium complex was observed.

Example 10

A polymer (CP-2) was obtained in the same manner as in Example 8 except that the amount of AIBN used as an initiator was changed to 2.0 mg. The polymer was found to have an Mw of 24,000 and a molecular weight distribution of 2.3. In addition, the polymer was found to have a Tg of 194° C. The element was evaluated in the same manner as in Example 2.

Example 11

A polymer (CP-3) is synthesized according to a scheme (20).

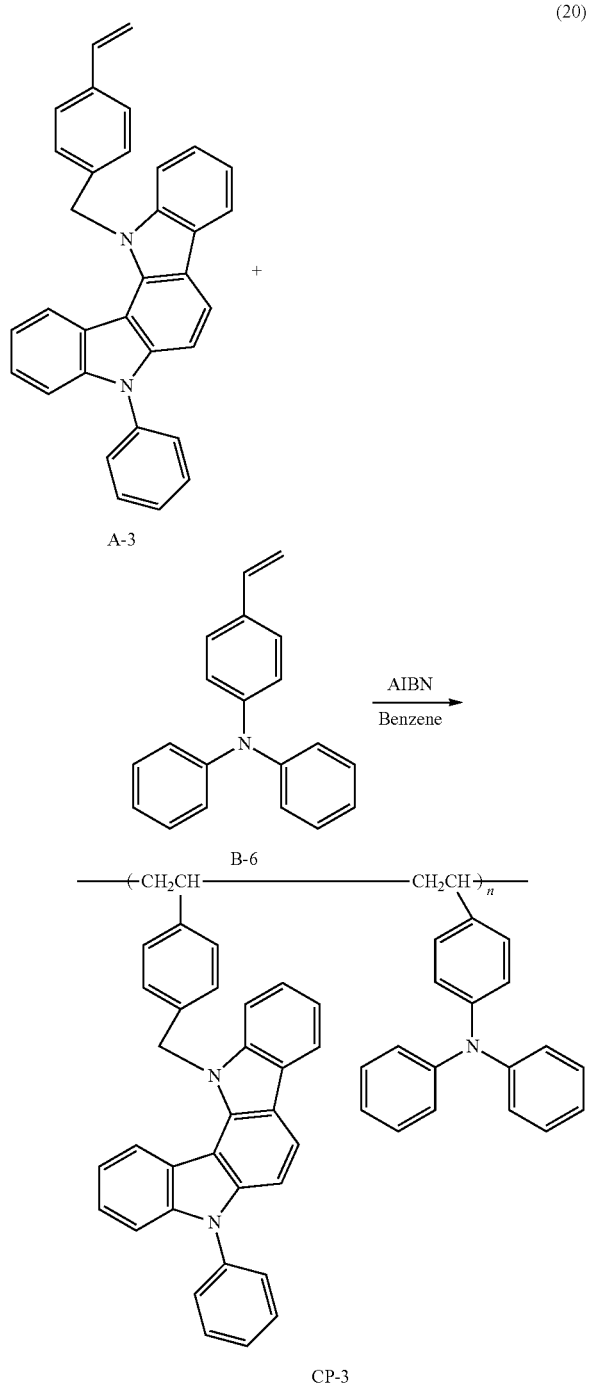

(20)

CP-3

5.0 mg of AIBN were fed as a catalyst to a mixed liquid including 0.45 g (1.0 mmol) of the compound (A-3), 0.03 g (0.11 mmol) of the compound (B-6), and 20 ml of anhydrous THF in a 50-ml recovery flask, and degassing and nitrogen purging of the resultant mixture were repeated, followed by polymerization at 60° C. for 24 hours. The polymerization solution was diluted and purified by reprecipitation with acetone. The purified polymer was collected and fed to acetone again to perform reslurrying repetitively, to thereby obtain 0.14 g of the copolymer (CP-3). The polymer was found to have an Mw of 21,000, a molecular weight distribution of 2.3, a Tg of 204° C., and a ratio of (A-3)/(B-6) of 84/16 (mol/mol). The element of the resultant copolymer (CP-3) was evaluated in the same manner as in Example 9.

Comparative Example 3

A polymer (EP-3) is synthesized according to a scheme (21).

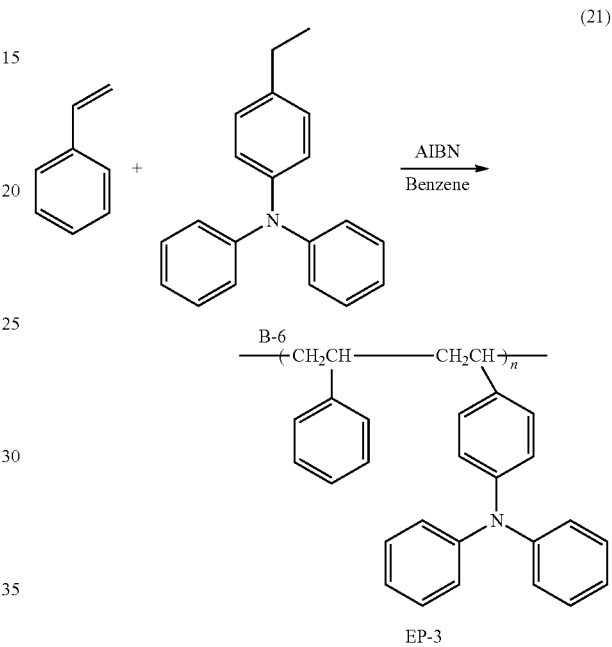

(21)

EP-3

The polymerization and aftertreatment were carried out in the same manner as in Example 8 except that styrene and the compound (B-6) were used as monomers. The resultant polymer (EP-3) was found to have an Mw of 32,000, a molecular weight distribution of 2.6, and a Tg of 119° C. The ratio of the repeating unit derived from styrene (St) and the repeating unit derived from the compound (B-6) was found to be (St)/(B-6)=62/38 (mol/mol). In addition, the element of the polymer was evaluated in the same manner as in Example 9.

Table 2 shows the polymers used in evaluation of the elements and the results of the evaluation. All the polymers are ones used in the hole transport layers.

TABLE 2

|  | Polymer | Mw ($\times 10^4$) | Tg (° C.) | Luminance (cd/m$^2$) | Voltage (V) |
| --- | --- | --- | --- | --- | --- |
| Example 9 | CP-1 | 9,000 | 193 | 9,700 | 7.2 |
| Example 10 | CP-2 | 24,000 | 194 | 10,100 | 7.1 |
| Example 11 | CP-3 | 21,000 | 204 | 8,200 | 7.5 |
| Comparative Example 3 | EP-3 | 32,000 | 119 | 2,300 | 9.2 |

INDUSTRIAL APPLICABILITY

When the polymer for an organic electroluminescent element of the present invention is used, an organic electroluminescent element having an improved hole injecting ability and excellent light emission efficiency can be obtained. In addition, a large-area element can be easily formed by a coating film formation method or the like.

The invention claimed is:

1. A polymer for an organic electroluminescent element, comprising a repeating unit represented by the following general formula (1) in a repeating unit constituting a main chain:

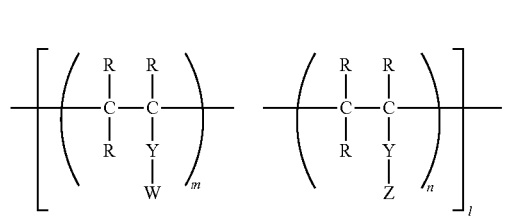

(1)

where R's each represent a hydrogen atom, a $C_1$ to $C_{20}$ alkyl group, a $C_1$ to $C_{20}$ alkoxy group, a $C_6$ to $C_{30}$ aryl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, or a $C_3$ to $C_{30}$ cycloalkyl group, and may be identical to or different from each other; Y's each represent a single bond, a $C_1$ to $C_{20}$ alkylene group, a $C_6$ to $C_{30}$ arylene group, a $C_3$ to $C_{30}$ heteroarylene group, CO, COO, or O; Z represents one kind or two or more kinds selected from indolocarbazolyl groups represented by the following formulae (2) to (7); W represents a charge transporting group and is different from Z; m and n represent molar ratios, m represents 0 to 95 mol %, and n represents 5 to 100 mol % relative to 100 mol % of all repeating units; and l represents an average number of repetitions and represents 2 to 10,000:

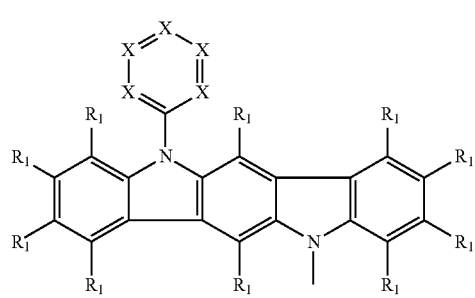

(2)

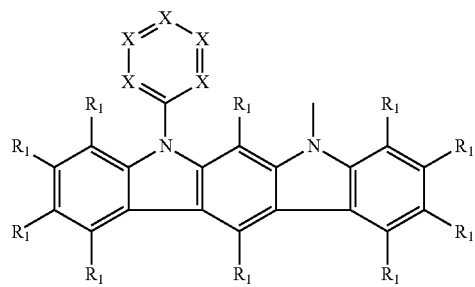

(3)

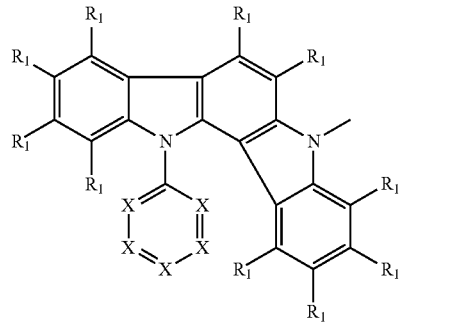

(4)

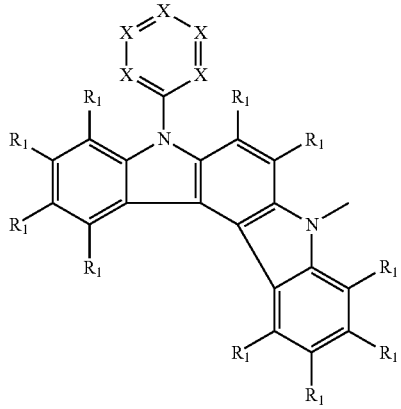

(5)

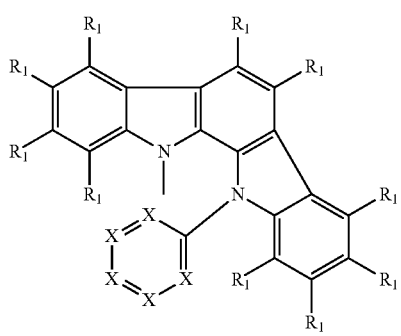

(6)

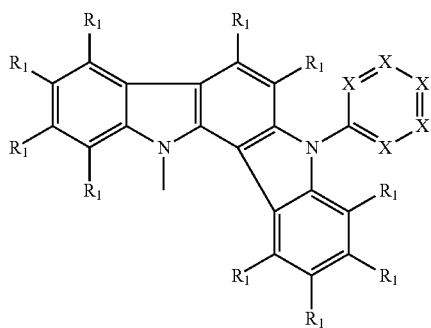

(7)

in the formulae (2) to (7), X's each independently represent C—H, N, or C-L; L independently represents a $C_6$ to $C_{30}$ aryl group, a $C_3$ to $C_{30}$ heteroaryl group, or a $C_{12}$ to $C_{60}$ diarylamino group; and $R_1$'s each independently represent a $C_1$ to $C_{20}$ alkyl group, a $C_1$ to $C_{20}$ alkoxy group, a $C_6$ to $C_{30}$ aryl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, or a $C_3$ to $C_{30}$ cycloalkyl group.

2. A polymer for an organic, electroluminescent element according to claim 1, wherein in the general formula (1), m represents 0 mol %.

3. A polymer for an organic electroluminescent element according to claim 1, wherein in the general formula (1), m represents 5 to 95 mol %, and n represents 5 to 95 mol %.

4. A polymer for an organic electroluminescent element according to claim 1, wherein the polymer for an organic electroluminescent element has a weight-average molecular weight of 1,000 to 1,000,000.

5. A polymer for an organic electroluminescent element according to claim 1, wherein in the general formula (1), W represents a charge transporting group represented by the following formula (8) or (9):

(8)

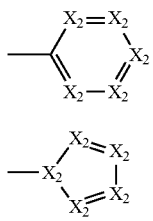

(9)

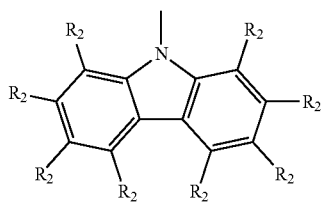

in the formula (8) or (9), $X_2$'s each independently represent C—H, N, O, S, or C-L; and L independently represents a $C_6$ to $C_{30}$ aryl group, a $C_3$ to $C_{30}$ heteroaryl group, or a $C_{12}$ to $C_{60}$ diarylamino group and may be bonded to a ring including $X_2$'s to form a condensed ring.

6. A polymer for an organic electroluminescent element according to claim 1, wherein in the general formula (1), W represents a charge transporting group represented by the following formula (10) or (11):

(10)

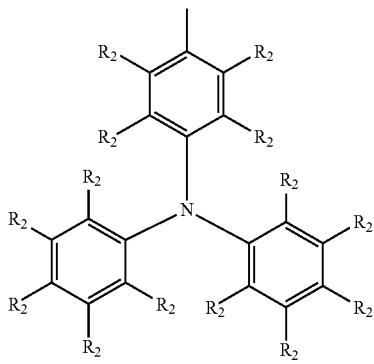

(11)

in the formula (10) or (11), $R_2$'s each represent a hydrogen atom, a $C_1$ to $C_{20}$ alkyl group, a $C_1$ to $C_{20}$ alkoxy group, a $C_6$ to $C_{30}$ aryl group, a $C_6$ to $C_{30}$ aryloxy group, a $C_7$ to $C_{36}$ arylalkyl group, a $C_7$ to $C_{36}$ arylalkyloxy group, a $C_3$ to $C_{30}$ heteroaryl group, a $C_3$ to $C_{30}$ heteroaryloxy group, or a $C_3$ to $C_{30}$ cycloalkyl group, and may be identical to or different from each other.

7. An organic electroluminescent element, comprising, organic layers between an anode layer and a cathode layer laminated on a substrate, wherein at least one of the organic layers includes the polymer for an organic electroluminescent element according to any one of claims 1 to 4, 5, and 6.

8. An organic electroluminescent element according to claim 7, wherein the organic layer including the polymer for an organic electroluminescent element comprises a hole transport layer.

* * * * *